(12) United States Patent
Shieh

(10) Patent No.: US 6,792,571 B2
(45) Date of Patent: Sep. 14, 2004

(54) VITERBI DETECTOR FOR PARTIAL RESPONSE MAXIMUM LIKELIHOOD SIGNAL PROCESSING

(75) Inventor: Jia-Horng Shieh, Taipei (TW)

(73) Assignee: Acer Laboratories Inc., Hsichin (TW)

( * ) Notice: Subject to any disclaimer, the term of this patent is extended or adjusted under 35 U.S.C. 154(b) by 489 days.

(21) Appl. No.: 09/985,346

(22) Filed: Nov. 2, 2001

(65) Prior Publication Data

US 2002/0073378 A1 Jun. 13, 2002

(30) Foreign Application Priority Data

Dec. 13, 2000 (TW) .......................................... 89126648 A

(51) Int. Cl.$^7$ .............................................. H03M 13/00
(52) U.S. Cl. ...................................... 714/795; 375/341
(58) Field of Search ............................... 714/794–795, 714/791–793; 375/341, 262, 265

(56) References Cited

U.S. PATENT DOCUMENTS 5,781,590 A * 7/1998 Shiokawa et al. .......... 375/341
5,910,969 A * 6/1999 Sayiner et al. .............. 375/341
5,940,416 A * 8/1999 Nishiya et al. ............. 714/795
6,148,043 A * 11/2000 Fujimoto .................... 375/341

* cited by examiner

*Primary Examiner*—Albert Decady
*Assistant Examiner*—Shelly A Chase
(74) *Attorney, Agent, or Firm*—Rabin & Berdo, P.C.

(57) ABSTRACT

A Viterbi detector for use in a partial response maximum likelihood (PRML) signal processing apparatus. The Viterbi detector can be used for different partial response (PR) equalizations with different parameters, and can be used for different PRML signal processing apparatuses such as high speed optical disk systems. The Viterbi detector includes an input buffer, a branch metric calculation unit, an add-compare-select circuit, a path memory unit, and a clock buffer. The Viterbi is designed based on a union trellis diagram relation obtained by combining trellis diagram relations associated with the PR equalizations with the parameters. According to the invention, the Viterbi detector has advantages of saving hardware space and conveniently changing PR equalizations with different parameters.

14 Claims, 25 Drawing Sheets

NRZI OUTPUT BIT/REFERENCE LEVEL

| | EQ(2T)VD(2T) | | | | EQ(T)VD(2T) | | | |
|---|---|---|---|---|---|---|---|---|
| | PR(1 1) | PR(1 a 1) | PR(1 b b 1) | PR(1 1) | PR(1 a 1) | PR(1 b b 1) |
| $B000_1$ | 00/0 | 00/0 | 00/0 | 00/{0,0} | 00/{0,0} | 00/{0,0} |
| $B000_2$ | 00/0 | 00/0 | 00/0 | 00/{0,0} | 00/{0,0} | 00/{$\frac{1}{2b+2}$,0} |
| $B000_3$ | 00/0 | 00/0 | 00/$\frac{1}{2b+2}$ | 00/{0,0} | 00/{0,$\frac{1}{a+2}$} | 00/{$\frac{1}{2}$,$\frac{1}{2b+2}$} |
| $B001_1$ | 01/0.5 | 01/$\frac{1}{a+2}$ | 01/$\frac{1}{2b+2}$ | 01/{0,0} | 01/{0,$\frac{1}{a+2}$} | 01/{0,$\frac{1}{2b+2}$} |
| $B001_2$ | 01/0.5 | 01/$\frac{1}{a+2}$ | 01/$\frac{1}{2b+2}$ | 01/{0,0.5} | 01/{0,$\frac{1}{a+2}$} | 01/{$\frac{1}{2b+2}$,$\frac{2b+1}{2b+2}$} |
| $B011_1$ | 11/1 | 11/$\frac{a+1}{a+2}$ | 11/$\frac{1}{2}$ | 11/{0.5,1} | 11/{$\frac{1}{a+2}$,$\frac{a+1}{a+2}$} | 11/{$\frac{1}{2b+2}$,$\frac{1}{2}$,$\frac{2b+1}{2b+2}$} |
| $B100_1$ | 00/0 | 00/$\frac{1}{a+2}$ | 00/$\frac{1}{2}$ | 00/{0.5,0} | 00/{$\frac{1}{a+2}$,$\frac{a+1}{a+2}$} | 00/{$\frac{1}{2b+2}$,$\frac{2b+1}{2b+2}$} |
| $B110_1$ | 10/0.5 | 10/$\frac{a+1}{a+2}$ | 10/$\frac{2b+1}{2b+2}$ | 10/{1,0.5} | 10/{1,$\frac{a+1}{a+2}$} | 10/{$\frac{2b+1}{2b+2}$,$\frac{2b+1}{2b+2}$} |
| $B110_2$ | 10/0.5 | 10/$\frac{a+1}{a+2}$ | 10/$\frac{2b+1}{2b+2}$ | 10/{1,0.5} | 10/{1,$\frac{a+1}{a+2}$} | 10/{1,$\frac{2b+1}{2b+2}$} |
| $B111_1$ | 11/1 | 11/1 | 11/$\frac{2b+1}{2b+2}$ | 11/{1,1} | 11/{$\frac{a+1}{a+2}$,1} | 11/{$\frac{1}{2}$,$\frac{2b+1}{2b+2}$,1} |
| $B111_2$ | 11/1 | 11/1 | 11/1 | 11/{1,1} | 11/{1,1} | 11/{$\frac{2b+1}{2b+2}$,1} |
| $B111_3$ | 11/1 | 11/1 | 11/1 | 11/{1,1} | 11/{1,1} | 11/{1,1} |

FIG. 15A

NRZ OUTPUT BIT/REFERENCE LEVEL

| | EQ(2T) VD(2T) | | | EQ(T) VD(2T) | | | |
|---|---|---|---|---|---|---|---|
| | PR (1 1) | PR (1 a 1) | PR (1 b b 1) | PR (1 1) | PR (1 a 1) | EQ(T) VD(2T) PR (1 a 1) | PR (1 b b 1) |
| B000$_1$ | 00/0 | 00/0 | 00/0 | 00/{0,0} | 00/{0,0} | 00/{0,0} | 00/{0,0} |
| B000$_2$ | 00/0 | 00/0 | 00/0 | 00/{0,0} | 00/{0,0} | 00/{0,0} | 00/{$\frac{1}{2b+2}$,0} |
| B000$_3$ | 00/0 | 00/0 | 00/$\frac{1}{2b+2}$ | 00/{0,0} | 00/{$\frac{1}{a+2}$,0} | 00/{$\frac{1}{a+2}$,0} | 00/{$\frac{1}{2}$,$\frac{1}{2b+2}$} |
| B001$_1$ | 01/0.5 | 01/$\frac{1}{a+2}$ | 01/$\frac{1}{2b+2}$ | 01/{0,0.5} | 01/{0,$\frac{1}{a+2}$} | 01/{0,$\frac{1}{a+2}$} | 01/{0,$\frac{1}{2b+2}$} |
| B001$_2$ | 01/0.5 | 01/$\frac{1}{a+2}$ | 01/$\frac{1}{2b+2}$ | 01/{0,0.5} | 01/{0,$\frac{1}{a+2}$} | 01/{0,$\frac{1}{a+2}$} | 01/{$\frac{1}{2b+2}$,$\frac{1}{2b+2}$} |
| B011$_1$ | 00/1 | 00/$\frac{a+1}{a+2}$ | 00/$\frac{1}{2}$ | 00/{0.5,1} | 00/{0.5,1} | 00/{$\frac{1}{a+2}$,$\frac{a+1}{a+2}$} | 00/{$\frac{1}{2b+2}$,$\frac{1}{2}$} |
| B100$_1$ | 00/0 | 00/$\frac{1}{a+2}$ | 00/$\frac{1}{2}$ | 00/{0.5,0} | 00/{$\frac{a+1}{a+2}$,$\frac{1}{a+2}$} | 00/{$\frac{a+1}{a+2}$,$\frac{1}{a+2}$} | 00/{$\frac{2b+1}{2b+2}$,$\frac{1}{2}$} |
| B110$_1$ | 01/0.5 | 01/$\frac{a+1}{a+2}$ | 01/$\frac{2b+1}{2b+2}$ | 01/{1,0.5} | 01/{1,$\frac{a+1}{a+2}$} | 01/{1,$\frac{a+1}{a+2}$} | 01/{$\frac{2b+1}{2b+2}$,$\frac{2b+1}{2b+2}$} |
| B110$_2$ | 01/0.5 | 01/$\frac{a+1}{a+2}$ | 01/$\frac{2b+1}{2b+2}$ | 01/{1,0.5} | 01/{1,$\frac{a+1}{a+2}$} | 01/{1,$\frac{a+1}{a+2}$} | 01/{1,$\frac{2b+1}{2b+2}$} |
| B111$_1$ | 00/1 | 00/1 | 00/$\frac{2b+1}{2b+2}$ | 00/{1,1} | 00/{$\frac{a+1}{a+2}$,1} | 00/{$\frac{a+1}{a+2}$,1} | 00/{$\frac{1}{2}$,$\frac{2b+1}{2b+2}$} |
| B111$_2$ | 00/1 | 00/1 | 00/1 | 00/{1,1} | 00/{1,1} | 00/{1,1} | 00/{$\frac{2b+1}{2b+2}$,1} |
| B111$_3$ | 00/1 | 00/1 | 00/1 | 00/{1,1} | 00/{1,1} | 00/{1,1} | 00/{1,1} |

NRZ OUTPUT BIT/REFERENCE LEVEL

| | EQ(2T) VD(2T) | | | | EQ(T) VD(2T) | | |
|---|---|---|---|---|---|---|---|
| | PR(1 1) | PR(1 a 1) | PR(1 b b 1) | PR(1 d c d 1) | PR(1 1) | PR(1 a 1) | PR(1 b b 1) | PR(1 d c d 1) |
| B0000₁ | 00/{in,0} | 00/{in,0} | 00/{in,0} | 00/{in,0} | 00/{0,0} | 00/{0,0} | 00/{0,0} | 00/{0,0} |
| B0000₂ | 00/{in,0} | 00/{in,0} | 00/{in,0} | 00/{in,0} | 00/{0,0} | 00/{0,0} | 00/{$\frac{1}{2b+2}$,0} | 00/{$\frac{1}{c+2d+2}$,0} |
| B0000₃ | 00/{in,0} | 00/{in,0} | 00/{in,0} | 00/{in, $\frac{1}{c+2d+2}$} | 00/{0,0} | 00/{$\frac{1}{a+2}$,0} | 00/{$\frac{1}{2}$, $\frac{1}{2b+2}$} | 00/{$\frac{d+1}{c+2d+2}$, $\frac{1}{c+2d+2}$} |
| B0001₁ | xx/{in, ∞} | xx/{in, ∞} | xx/{in, ∞} | 01/{in, $\frac{1}{c+2d+2}$} | xx/{∞,∞} | xx/{∞,∞} | xx/{∞,∞} | 01/{0, $\frac{1}{c+2d+2}$} |
| B0001₂ | xx/{in, ∞} | xx/{in, ∞} | xx/{in, ∞} | 01/{in, $\frac{1}{c+2d+2}$} | xx/{∞,∞} | xx/{∞,∞} | xx/{∞,∞} | 01/{$\frac{1}{c+2d+2}$, $\frac{1}{c+2d+2}$} |
| B0001₃ | xx/{in, ∞} | xx/{in, ∞} | xx/{in, ∞} | 01/{in, $\frac{2}{c+2d+2}$} | xx/{∞,∞} | xx/{∞,∞} | xx/{∞,∞} | 01/{$\frac{d+1}{c+2d+2}$, $\frac{2}{c+2d+2}$} |
| B0011₁ | 01/{in,0.5} | 01/{in, $\frac{1}{a+2}$} | 01/{in, $\frac{1}{2b+2}$} | 00/{in, $\frac{d+1}{c+2d+2}$} | 01/{0,0.5} | 01/{0, $\frac{1}{a+2}$} | 01/{0, $\frac{1}{2b+2}$} | 00/{$\frac{1}{2}$, $\frac{d+1}{c+2d+2}$} |
| B0011₂ | 01/{in,0.5} | 01/{in, $\frac{1}{a+2}$} | 01/{in, $\frac{1}{2b+2}$} | 00/{in, $\frac{d+1}{c+2d+2}$} | 01/{0,0.5} | 01/{0, $\frac{1}{a+2}$} | 01/{$\frac{1}{2b+2}$, $\frac{1}{2b+2}$} | 00/{$\frac{2}{c+2d+2}$, $\frac{d+1}{c+2d+2}$} |
| B0111₁ | 00/{in,1} | 00/{in, $\frac{1}{a+2}$, $\frac{a+1}{a+2}$} | 00/{in, $\frac{1}{2}$} | xx/{in, ∞} | 00/{0.5,1} | 00/{$\frac{1}{a+2}$, $\frac{a+1}{a+2}$} | 00/{$\frac{1}{2b+2}$, $\frac{2b+1}{2b+2}$} | xx/{∞, ∞} |
| B0111₂ | xx/{in, ∞} | xx/{in, ∞} | xx/{in, ∞} | 00/{in, $\frac{c+d+1}{c+2d+2}$} | xx/{∞,∞} | xx/{∞,∞} | xx/{∞,∞} | 00/{$\frac{d+1}{c+2d+2}$, $\frac{c+d+1}{c+2d+2}$} |
| B1000₁ | xx/{in, ∞} | xx/{in, ∞} | xx/{in, ∞} | 00/{in, $\frac{d+1}{c+2d+2}$} | xx/{∞,∞} | xx/{∞,∞} | xx/{∞,∞} | 00/{$\frac{c+d+1}{c+2d+2}$, $\frac{d+1}{c+2d+2}$} |
| B1000₂ | 00/{in,0} | 00/{in, $\frac{1}{2}$} | 00/{in, $\frac{1}{2}$} | xx/{in, ∞} | 00/{0.5,0} | 00/{$\frac{a+1}{a+2}$, $\frac{1}{a+2}$} | 00/{$\frac{2b+1}{2b+2}$, $\frac{1}{2b+2}$} | xx/{∞, ∞} |
| B1100₁ | 01/{in,0.5} | 01/{in, $\frac{a+1}{a+2}$} | 01/{in, $\frac{2b+1}{2b+2}$} | 00/{in, $\frac{c+d+1}{c+2d+2}$} | 01/{1,0.5} | 01/{1, $\frac{a+1}{a+2}$} | 01/{$\frac{2b+1}{2b+2}$, $\frac{2b+1}{2b+2}$} | 00/{$\frac{c+2d}{c+2d+2}$, $\frac{c+d+1}{c+2d+2}$} |
| B1100₂ | 01/{in,0.5} | 01/{in, $\frac{a+1}{a+2}$} | 01/{in, $\frac{2b+1}{2b+2}$} | 00/{in, $\frac{c+d+1}{c+2d+2}$} | 01/{1,0.5} | 01/{1, $\frac{a+1}{a+2}$} | 01/{1, $\frac{2b+1}{2b+2}$} | 00/{$\frac{c+2d+1}{c+2d+2}$, $\frac{c+d+1}{c+2d+2}$} |
| B1110₁ | xx/{in, ∞} | xx/{in, ∞} | xx/{in, ∞} | 01/{in, $\frac{c+2d}{c+2d+2}$} | xx/{∞,∞} | xx/{∞,∞} | xx/{∞,∞} | 01/{$\frac{c+d+1}{c+2d+2}$, $\frac{c+2d}{c+2d+2}$} |
| B1110₂ | xx/{in, ∞} | xx/{in, ∞} | xx/{in, ∞} | 01/{in, $\frac{c+2d+1}{c+2d+2}$} | xx/{∞,∞} | xx/{∞,∞} | xx/{∞,∞} | 01/{$\frac{c+2d+1}{c+2d+2}$, $\frac{c+2d+1}{c+2d+2}$} |
| B1110₃ | xx/{in, ∞} | xx/{in, ∞} | xx/{in, ∞} | 01/{in, $\frac{c+2d+1}{c+2d+2}$} | xx/{∞,∞} | xx/{∞,∞} | xx/{∞,∞} | 01/{1, $\frac{c+2d+1}{c+2d+2}$} |
| B1111₁ | 00/{in,1} | 00/{in,1} | 00/{in, $\frac{1}{2}$, $\frac{2b+1}{2b+2}$} | 00/{in, $\frac{c+d+1}{c+2d+2}$, $\frac{c+2d+1}{c+2d+2}$} | 00/{1,1} | 00/{$\frac{a+1}{a+2}$,1} | 00/{$\frac{1}{2}$, $\frac{2b+1}{2b+2}$} | 00/{$\frac{c+d+1}{c+2d+2}$, $\frac{c+2d+1}{c+2d+2}$} |
| B1111₂ | 00/{in,1} | 00/{in,1} | 00/{in, $\frac{2b+1}{2b+2}$} | 00/{in,1} | 00/{1,1} | 00/{1,1} | 00/{$\frac{2b+1}{2b+2}$,1} | 00/{$\frac{c+2d+1}{c+2d+2}$,1} |
| B1111₃ | 00/{in,1} | 00/{in,1} | 00/{in,1} | 00/{in,1} | 00/{1,1} | 00/{1,1} | 00/{1,1} | 00/{1,1} |

FIG. 17B

VITERBI DETECTOR FOR PARTIAL RESPONSE MAXIMUM LIKELIHOOD SIGNAL PROCESSING

This application incorporates by reference Taiwanese application Serial No. 89126648, filed on Dec. 13, 2000.

BACKGROUND OF THE INVENTION

1. Field of the Invention

The invention relates in general to a Viterbi detector for partial response maximum likelihood (PRML) signal processing, and more particularly to a Viterbi detector capable of varying sampling rate and using different parameters for PRML signal processing and capable of being implemented with a single piece of hardware.

2. Description of the Related Art

While various approaches to recording information codes in a recording medium are provided for the improvement of information access density, partial response maximum likelihood (PRML) signal processing, is widely used in recording medium systems, such as optical disk systems.

In the process of transmitting signals, when the channel bandwidth is lower than the bandwidth of the signals transmitted in the channel, inter-symbol interference (ISI) occurs in adjacent bits of the signals in the receiving end. When ISI is serious, it may cause jitter. As the recording density of optical disks increases, jitter caused by ISI becomes more serious, increasing the difficulty in phase-locking. For overcoming this phenomenon, the principle of partial response (PR) channel is applied. In PRML signal processing, the channel response is appropriately equalized in a channel response in terms of a PR polynomial. In this way, ISI is constrained and is in an expectable characteristic, resulting in reduction of jitter when ISI occurring. Thus, the performance of phase-locking is improved. In other words, PRML is potentially a technique of improving the recording density of optical disks.

The PRML signal processing includes the following steps. At first, information codes are read from an optical disk. Then the information codes are inputted to a PR equalizer to perform waveform equalization. Next, detection is performed on the output signal of the PR equalizer by using Viterbi algorithm.

Referring to FIG. 1, it illustrates a PRML signal processing apparatus using mark edge (ME) recording method. In FIG. 1, modulated information code E is first inputted into a return-to-zero inversion (NRZI) circuit 102. The modulated information code signal E is then processed by an exclusive-OR gate 104 and a delay element 106 of the NRZI circuit 102, resulting in an output signal F of the NRZI circuit 102. After that, the output signal F of the NRZI circuit 102 is written to a recording medium 108, such as an optical disk. In addition, when the information code signal E has a rising edge, the output signal F of the NRZI circuit 102 has a signal level change, such as a change from zero to one, or from one to zero.

As an example of PRML signal processing, in FIG. 1, PR(1, 2, 1) equalization for the output signal F of the NRZI circuit 102 is performed, and the minimum code reversal distance δ is set to two, wherein δ=2 indicates that there are at least two "0" between adjacent "1" in the input signal E of the NRZI circuit 102.

Referring now to FIG. 2, it illustrates the waveforms of the signals in FIG. 1 and corresponding pits on the optical disk, where the signals include the information code signal E, output signal F of the NRZI circuit, reproduction signal G, output signal J' of the PR equalizer, and output signal Z of the Viterbi detector. In FIG. 2, the bit sequence in (a) corresponds to an example the information code signal E while the bit sequence in (b) illustrates the corresponding output signal F of the NRZI circuit 102. When the information code signal E has a signal level change of rising edge, the signal Z has a signal level change of itself as well; otherwise, the signal level of the signal Z remains unchanged. The signal in (c) is the LD driving signal produced according to the signal F and is used for controlling a LD (not shown in Figures) to perform write operation on the optical disk. Illustration in (d) is to show the pits on the optical disk which the LD performs the write operation on. The signal of (e) is the reproduction signal G corresponding to the data read from the optical disk by using the optical head. The signal of (f) is the output signal J' of the PR equalizer 110 after the PR(1, 2, 1) process. And the signal of (g) is the output signal Z of the Viterbi detector 112 obtained after processing the signal J'. The PR equalizer 110 and Viterbi detector 112 are called a reproduction signal processing unit 114.

In addition, the output signal of Viterbi detector 112 is in terms of NRZI signal. When the output signal F of the NRZI circuit 102 has a signal level change of either rising edge or falling edge, the corresponding output signal Z of the Viterbi detector 112 is set to one; otherwise, it is set to zero.

In FIG. 2, when the signal F is in a 1 state, the LD driving signal is in the high level and a pit is correspondingly produced on the optical disk.

The reproduction signal processing unit 114 is used for generating the output signal Z of the Viterbi detector 112 by using the reproduction signal G, where the signal Z is theoretically identical to the information code signal E.

The PR equalizer 110 is employed to perform PR(1, 2, 1) equalization. The characteristic of PR(1, 2, 1) equalization is:

$$J'(t)=0.25\ G(t-1)+0.5\ G(t)+0.25\ G(t+1),$$

Where J'(t) denotes the value of output signal J' of the PR equalizer at time t, G(t−1), G(t), and G(t+1) denote the values of reproduction signal G at times t−1, t, and t+1 respectively.

As shown in FIG. 2 (f), the signal J' at each point of time is close to one of four levels {0, 0.25, 0.75, 1} (indicated by four parallel lines). Then, the signal J' is inputted to the Viterbi detector 112. Finally, the Viterbi detector 112 produces the output signal Z, which is identical to the information code signal E.

Viterbi detector 112 further stores signal level transition patterns of the output signal J' of the PR equalizer 110 corresponding to each point of time in the form of a trellis. In addition, the Viterbi detector 112 only outputs binary signal 0 or 1 at each point of time. Moreover, when the PR equalizer's output signal J' has noise, the Viterbi detector 112 selects the nearest signal level transition pattern and stores the selected transition patterns in Viterbi detector 112.

Referring to FIG. 3, it illustrates a structure of the conventional PR equalizer in FIG. 1. The PR equalizer 110 includes a plurality of delay units (for example, delay units 302, 304, and 306), a plurality of multipliers (for example, multipliers 308, 310, 312, and 314), and an adder 316. The delay units are connected in series and delay respective input signals for one time unit. In this way, the signal G is delayed by the delay units, resulting in signals $i_N, i_{N-1}, i_{N-2}, \ldots, i_1$ associated with different delay periods. The signals $i_N, i_{N-1},$ $i_{N-2}, \ldots, i_1$ are then multiplied by coefficients $C_1, C_2, C_3, \ldots, C_N$ respectively, and the products are inputted to the adder 316. The sum of $i_N C_1, i_{N-1}C_2, i_{N-2}C_3, \ldots, i_1 C_N$ is the output of the adder 316, regarding as the output signal J' of the PR equalizer 110, where the values of $C_1, C_2, C_3, \ldots, C_N$ are associated with the parameters of the PR equalization.

Referring to FIG. 4, it illustrates the Viterbi detector 112 in FIG. 1 in block diagram form. The Viterbi detector 112 includes a branch metric calculation circuit 402, an add-compare-and-select (ACS) circuit 404 and a path memory unit 406. The branch metric calculation circuit 402 is for receiving the output signal J' of the PR equalizer 110 and calculating the values $B000_1, B000_2, B001_1, B011_1, B100_1, B110_1, B111_1,$ and $B111_2$, called the branch metrics. The ACS circuit 404 is for outputting a path memory control signals H000 and H111 based on the branch metrics above. The path memory unit 406 is controlled by the path memory control signals H000 and H111, outputting the output signal Z of the Viterbi detector 112.

FIG. 5 is a block diagram of the branch metric calculation circuit 402 in FIG. 4. The branch metric calculation circuit 402 includes four subtractors 502, four multiplier 504, and four registers 506. In FIG. 4, the subtractors 502 respectively calculate J'−0, J'−0.25, J'−0.75, and J'−1. Next, the outputs of the subtractors are respectively processed by the multipliers 504 for obtaining the respective squares. Then, the four squares of the difference of the PR equalizer output signal J' and four equalization-aimed values $\{0, 0.25, 0.75, 1\}$ are stored in the delay units 506 respectively. The branch metric calculation circuit 402 outputs the branch metrics $B000_1, B000_2, B001_1, B011_1, B100_1, B110_1, B111_1,$ and $B111_2$ respectively. For each point of time, the branch metrics are as follows:

$B000_1 = B000_2 = (0 - J')^2,$
$B001_1 = B100_1 = (0.25 - J')^2,$
$B011_1 = B110_1 = (0.75 - J')^2,$ and
$B111_1 = B111_2 = (1.0 - J')^2.$ Referring now to FIG. 4, the branch metrics are inputted into the ACS circuit 404. The branch metrics represent the degree and nearness of the PR equalizer output signal J' obtained from the PR(1, 2, 1) equalization of the reproduction signal, and the ideal PR(1, 2, 1) equalization signal.

Referring to FIG. 6, it illustrates the ACS circuit 404 in FIG. 4 in a block diagram. The ACS circuit 404 uses six path metrics, P000, P001, P011, P100, P110, and P111, and the initial values of them are set to zero. The ACS circuit 404 derives the path metric at time t from the branch metric at time t−1 and performs comparison of $P000(t)+B000_1(t)$ and $P100(t)+B100_2(t)$ as well as $P011(t)+B111_1(t)$ and $P111(t)+B111_2(t)$. From this, the ACS circuit 404 determines and outputs the path control signals H000(t) and H111(t).

When $P000(t+1)+B000_1(t)=min\{P000(t)+B000_1(t), P100(t)+B000_2(t)\}$, H000(t) is equal to zero. When $P100(t+1)+B000_2(t)=min\{P000(t)+B000_1(t), P100(t)+B000_2(t)\}$, H000 (t) is equal to one.

When $P011(t+1)+B111_1(t)=min\{P011(t)+B111_1(t), P111(t)+B111_2(t)\}$, H111(t) is equal to zero. When $P111(t+1)+B111_2(t)=min\{P011(t)+B111_1(t), P111(t)+B111_2(t)\}$, H111 (t) is equal to one.

Further, the ACS circuit 404 updates the values of the path metrics P000(t+1), P001(t+1), P011(t+1), P100(t+1), P110(t+1), and P111(t+1) according to the following expressions:

$P000(t+1) = min\{P000(t)+B000_1(t), P100(t)+B000_2(t)\},$
$P001(t+1) = P000(t)+B001_1(t),$
$P011(t+1) = P001(t)+B011_1(t),$
$P100(t+1) = P110(t)+B100_1(t),$
$P110(t+1) = P111(t)+B110_1(t),$ and
$P111(t+1) = min\{P011(t)+B111_1(t), P111(t)+B111_2(t)\}.$ In FIG. 6, adder 602 is used to sum its two inputs, the comparator 604 and the selector 606 are used for performing the operation of min{x, y}, that is, selecting the smaller one from the parameters x and y. The register 608 is to hold the path metric values.

Referring to FIG. 7, it illustrates path memory unit 406 in FIG. 4. The path memory unit 406 includes n detection sequence switches $702_1$ to $702_n$, and 6(n−1) delay units 704, where n is an integer greater than one. Two adjacent detection sequence switches are coupled by using six of the delay units 704 in parallel. In addition, the path control signals H000 and H111 are inputted to the detection sequence switches $702_1$ to $702_n$ respectively. At every time t, the path memory unit 406 outputs a binary signal.

Referring to FIGS. 8A–8D, they illustrate the connection and switching relation between inputs and outputs of the detection sequence switches $702_1$ to $702_n$, wherein X, and $Y_i$ respectively represent an input and output of one of the detection sequence switches $702_1$ to $702_n$ and i is an integer. If an input and an output are connected, it is represented by a line connecting two circles indicating the input and output. The dotted line indicates that the two circles (an input and an output) at the ends of the dotted line are not not connected. To be specific, FIGS. 8A–8D indicate the connection of the inputs and outputs of the detection sequence switches $702_1$ to $702_n$ for the path memory signals (H000, H111)=(0, 0), (0, 1), (1, 0), and (1, 1) respectively.

For example, the operation of the detection sequence switches $702_1$ to $702_n$ in FIG. 7 for (H000, H111)=(0, 0) is described as follows. The delay units 704 receive the output values of one of the detection sequence switches, delay them for one time unit T, and then outputs delayed values of the detection sequence switch to the next detection sequence switch. Each of the detection sequence switches $702_1$ to $702_n$ includes six input terminals X1 to X6, and six output terminals Y1 to Y6. The path memory unit 406 uses the output signal at the output terminal Y1 of the detection sequence switch $702_n$ as the output signal of the path memory unit 406, that is, the output signal Z of the Viterbi detector for {0, 1}.

Referring to FIG. 9, it illustrates a trellis diagram of signal level transition rule. In FIG. 9, after PR(1, 2, 1) equalization, the output signal J' of the PR equalizer 110 has a minimum code reversal distance equal to two, and the associated transition rule is shown in FIG. 2. In addition, the connection of the detection sequence switches $702_1$ to $702_n$ in FIG. 7 is according to the trellis diagram. In FIG. 9, when the output of the Viterbi detector 112 is an NRZI signal, the output bits and reference levels are indicated after branch (000, 000) 902, branch (100, 000) 904, branch (000, 001) 906, branch (001, 011) 908, branch (110, 100) 910, branch (111, 110) 912, branch (011, 111) 914, and branch (111, 111) 916 respectively. When the output of the Viterbi detector 112 is an NRZ signal, the output bits and reference levels are indicated in the right side of FIG. 9 and associated with the branches 902 to 916 respectively.

In FIG. 9, each circle represents a state in the trellis diagram and the branches connect states at time t with states at time t−1. The connection of the branches determines the connection of the detection sequence switches $702_1$ to $702_n$. The signal J' outputted by the PR equalizer 110 has six states: S000, S001, S011, S100, S110, and S111. In FIG. 9, the reference levels define the four equalization-aimed values {0, 0.25, 0.75, 1} in FIG. 5 while the output bits define the values of V1, V2, V3, V4, V5, and V6 in FIG. 7.

In FIG. 9, branch (x, y) indicates a transition from a state Sx at time t−1 to a state Sy at time t. In addition, branch (000, 000) 902, branch (100, 000) 904, branch (000, 001) 906, branch (001, 011) 908, branch (110, 100) 910, branch (111, 110) 912, branch (011, 111) 914, and branch (111, 111) 916 are associated with the branch metrics $B000_1$, $B000_1$,$B000_2$, B001, B011, B100, B110, $B111_1$, and $B111_2$ respectively. In another aspect, a branch metric indicates the cost of a transition from a state at time t−1 to a state at time t. In this way, the Viterbi detector 112 is to calculate the cost of each path through the branch metrics as so to obtain a path control signal (H000, H111) with the minimum cost. According to the path control signal (H000, H111), the Viterbi detector 112 selects one of the connections of the inputs and outputs of the detection sequence switches $702_1$ to $702_n$ as illustrated in FIGS. 8A–8D as so to obtain the output signal Z of the Viterbi detector 112.

The structure of the conventional PRML signal processing apparatus described above is to improve the data correctness when data are read from the recording medium, such as an optical disk. However, it is difficult to implement a high speed optical disk system with the conventional structure. For example in a sixteen times digital video disk (DVD) system, the time interval between adjacent data units to be read is only 2.4 ns and thus it is too difficult for the conventional PRML signal processing apparatus to fulfil this requirement.

Besides, when PR equalization is to be performed with another parameters, such as performing PR(1, 1), PR(1, 2, 1), PR(1, 1, 1, 1), or PR(1, 2, 0, 2, 1), the hardware structure of the Viterbi detector 112 have to be modified to fulfil this requirement. In this way, the conventional structure brings inconvenience in application and design of system with the requirement.

SUMMARY OF THE INVENTION

It is therefore an object of the invention to provide a Viterbi detector for partial response maximum likelihood (PRML) signal processing apparatus. The Viterbi detector according to the invention can be used for different PRML signal processing apparatuses such as high speed optical disk systems. In addition, the Viterbi detector can perform PR equalization with different parameters. In this way, the Viterbi detector has advantages of saving hardware space and conveniently changing PR equalizations with different parameters.

The invention achieves the above-identified objects by providing a Viterbi detector for use in a PRML signal processing apparatus, wherein the PRML signal processing apparatus includes a partial response (PR) equalizer outputting a PR equalizer output signal serially. The PR equalizer operates at a first frequency and the Viterbi detector operates at a second frequency. The Viterbi detector is used for receiving the PR equalizer output signal and is capable of performing Viterbi detection according to PR equalizations with a plurality of sets of parameters in the PR equalizer. The Viterbi detector includes an input buffer, a branch metric calculation unit, an add-compare-select (ACS) circuit, a path memory unit, and a clock buffer. The input buffer is for receiving the PR equalizer output signal, and selectively outputting the PR equalizer output signal serially or in parallel, according to the first frequency and the second frequency. The branch metric calculation unit is employed to receive the PR equalizer output signal outputted by the input buffer and receive a reference level value stored in a reference level register so as to obtain a plurality of branch metrics. The ACS circuit is then to receive the branch metrics, calculate a plurality of path metrics, and obtain a plurality of path control signals. The path memory unit, includes a detection sequence switch, is used for receiving the path control signals, using an output bit value stored in a storage unit as an input to the detection sequence switch, and outputting a Viterbi detector output signal. The clock buffer is to generate a clock signal at the second frequency and output the clock signal at the second frequency to the branch metric calculation unit, the ACS circuit, and the path memory unit.

The detector sequence switch is operative according to a union trellis diagram relation, wherein the union trellis diagram relation is obtained by combining trellis diagram relations associated with the PR equalizations with the sets of parameters in the PR equalizer and setting the PR equalizer and the Viterbi detector operating at the first frequency and the second frequency respectively. The union trellis diagram relation indicates a plurality of sets of output bits and a plurality of sets of reference levels which are associated with the PR equalizations with the sets of parameters respectively. The output bits are stored in the storage unit while the reference levels are stored in the reference level register. According to the first, second frequencies, and the PR equalization with the set of parameters, the storage unit and the reference level register output the output bit value and the reference level value respectively.

BRIEF DESCRIPTION OF THE DRAWINGS

Other objects, features, and advantages of the invention will become apparent from the following detailed description of the preferred but non-limiting embodiments. The description is made with reference to the accompanying drawings in which:

FIGS. 15A–15B are tables associated with FIG. 14, illustrating the output bits and reference levels of NRZI and NRZ for each branch of PR(1, 1), PR(1, a, 1), and PR(1, b, b, 1) equalizations in EQ(T)_VD(T) and EQ(T)_VD(2T) modes;

FIGS. 17A–17B are tables associated with FIG. 16, illustrating the output bits and reference levels of NRZI and NRZ for all branches of PR(1, 1), PR(1, a, 1), PR(1, b, b, 1), and PR(1, c, d, c, 1) equalizations in EQ(T)_VD(T) and EQ(T)_VD(2T) modes;

DESCRIPTION OF THE PREFERRED EMBODIMENT

When an optical disk system requires a speed beyond conventional limits, for example in a 16X digital video disk (DVD) system which requires an access rate at 420 MHz, that is, a clock pulse width of 2.4 ns (1 ns=$10^{-9}$ sec), the Viterbi detector for the optical disk system is too difficult to be realized; besides, its dissipation power is excessively high. In order to resolve this problem, one way is to make the PRML signal processing apparatus for the optical disk system operating at 1/2T, where T is the operating period of the optical disk system. In other words, under the condition of having one input, the Viterbi detector takes one data point from every two data points.

For resolving the above problem, another way to realize the PRML signal processing apparatus is to allow the PR equalizer operating at 1/T, make the Viterbi detector operate at 1/2T, and employ two inputs ($P_{t-1}$, $P_t$).

In this way, a reproduction signal processing unit formed by a PR equalizer and a Viterbi detector is defined to operate in three modes:

(a) EQ(T)_VD(T) mode: Both the PR equalizer and the Viterbi detector operate at 1/T. The Viterbi detector uses one input $P_t$ to receive an output signal $J'_t$ of the PR equalizer.

(b) EQ(T)_$_{VD(}$2T) mode: The PR equalizer operates at 1/T and the Viterbi detector operates at 1/2T. The Viterbi detector uses two inputs ($P_{t-1}$, $P_t$) to receive two output signals ($J'_{t-1}$, $J'_t$) of the PR equalizer.

(c) EQ(2T)_VD(2T) mode: Both the PR equalizer and the Viterbi detector operate at 1/2T. The Viterbi detector uses one input Pt to receive an output signal $J'_t$ of the PR equalizer.

Figure 10A:
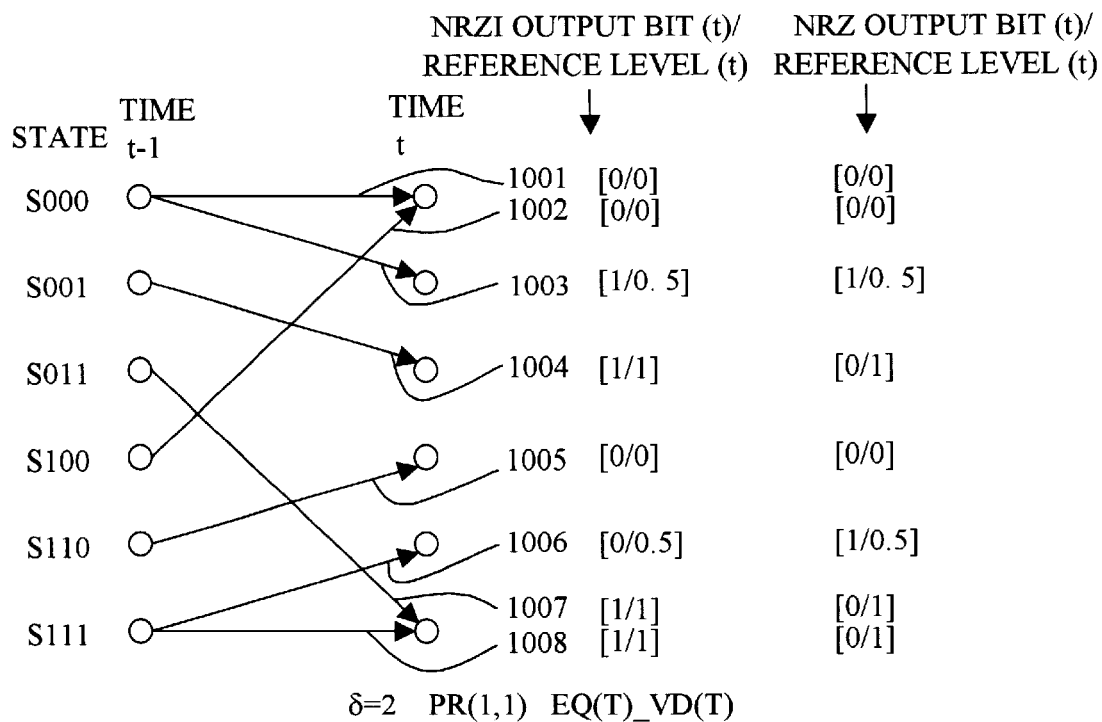
FIGS. 10A–10C is a trellis diagram associating with a Viterbi detector for PR(1, 1) equalization.
Figure 10B:
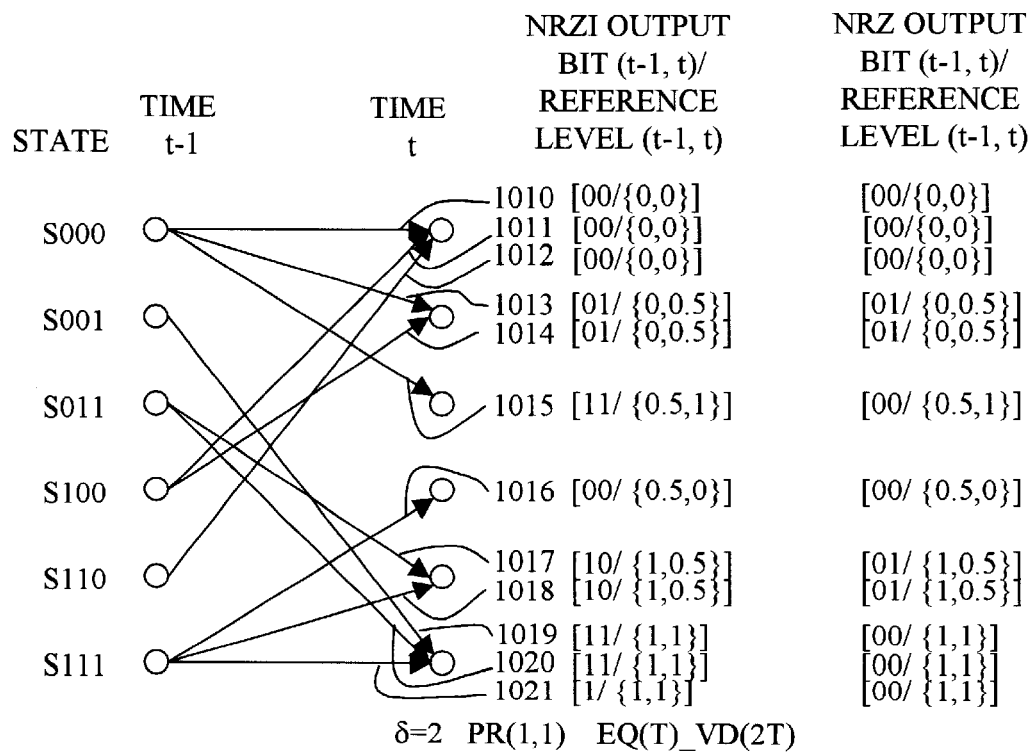
Figure 10C:
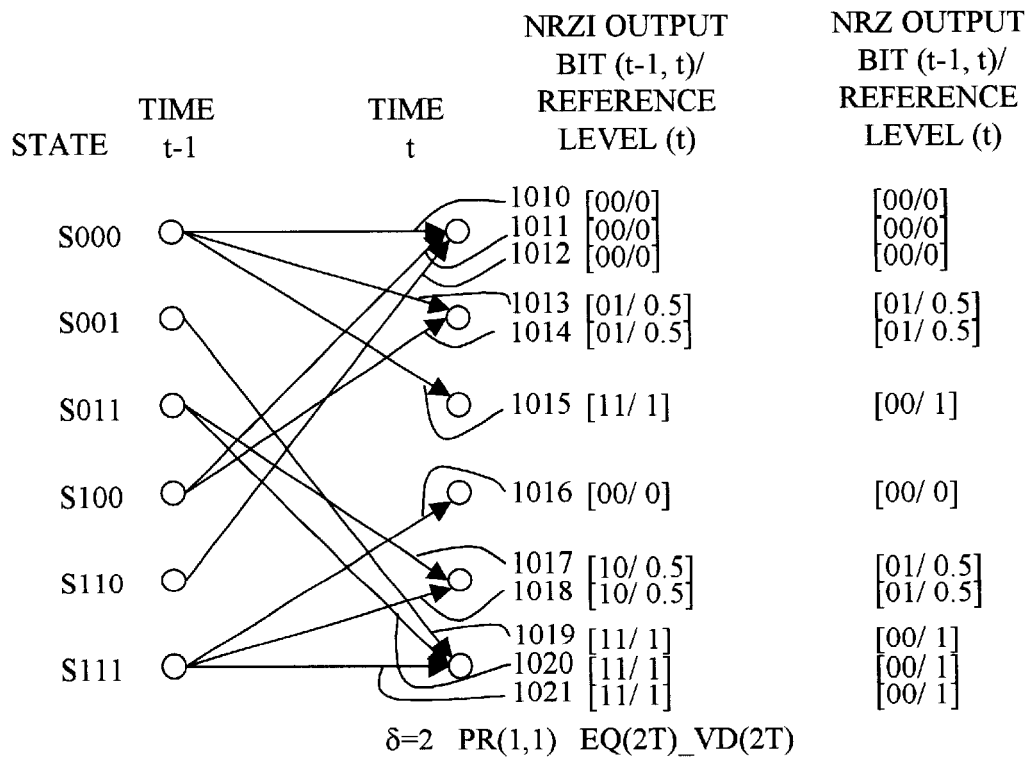
Figure 11A:
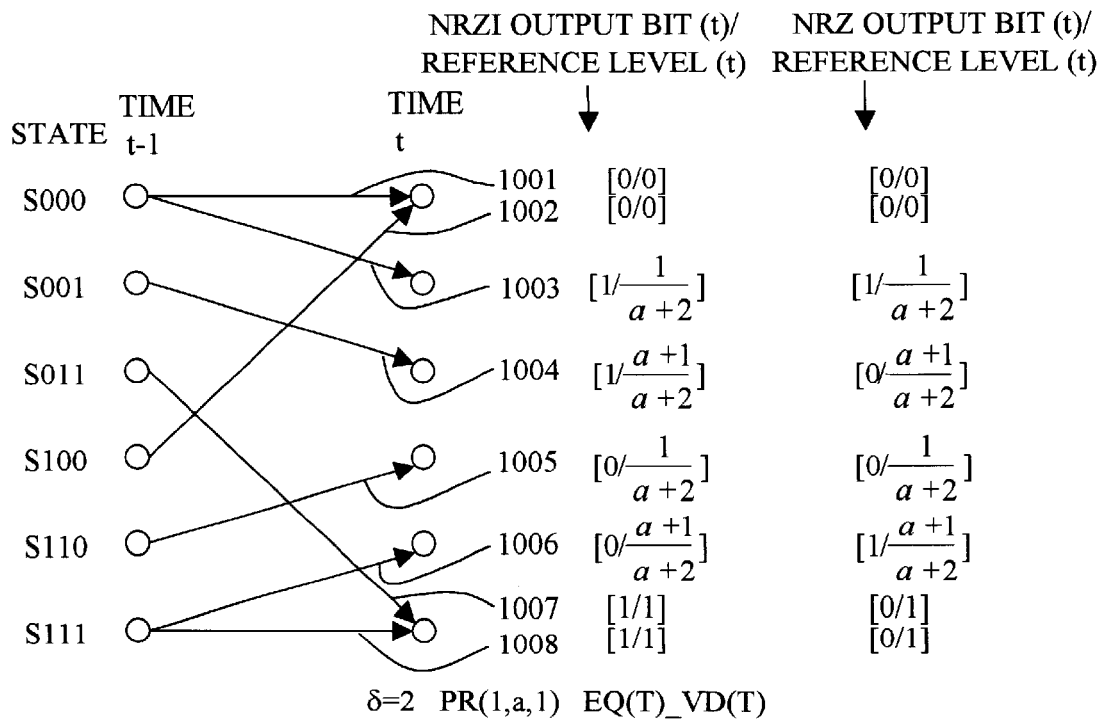
FIGS. 11A–11C is a trellis diagram associating with a Viterbi detector for PR(1, a, 1) equalization.
Figure 11B:
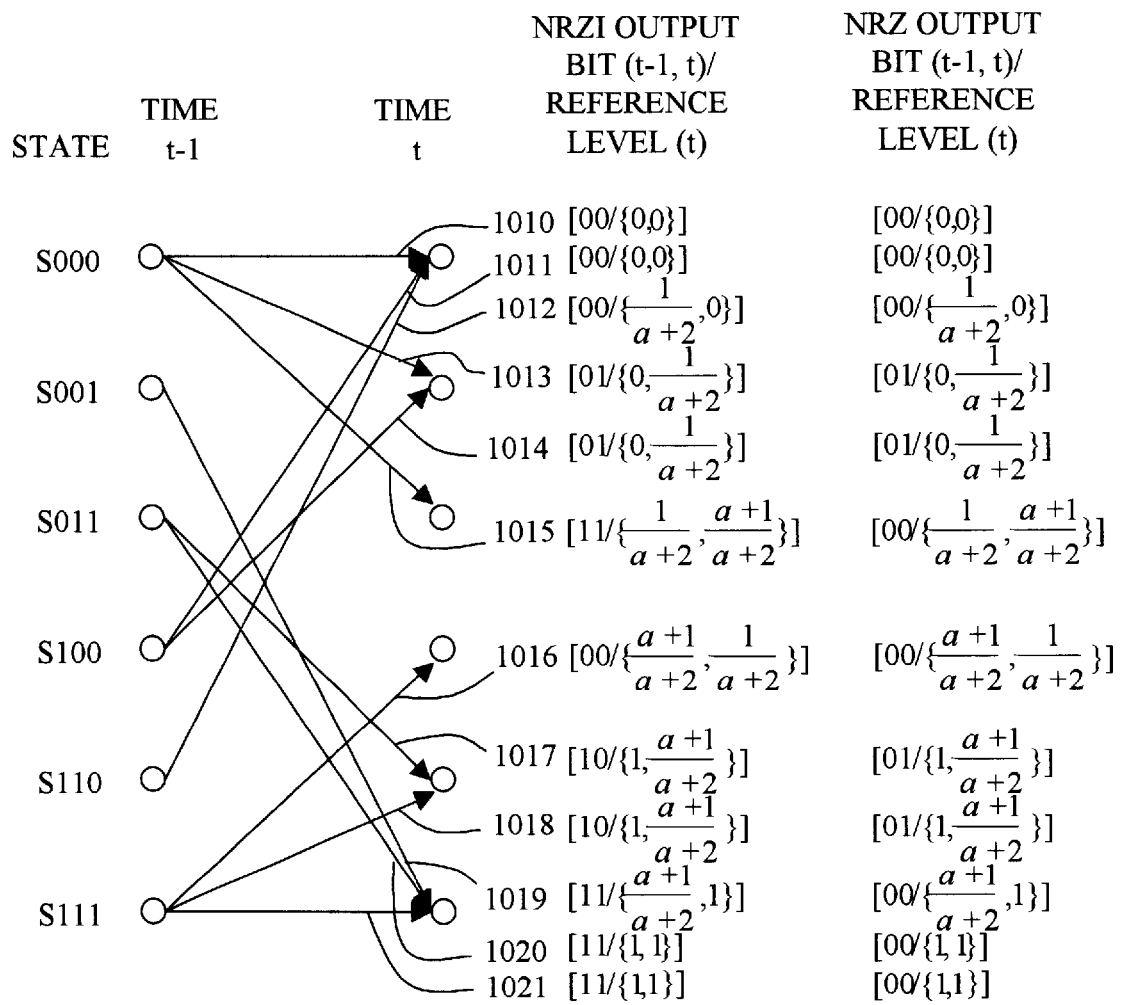
Figure 11C:
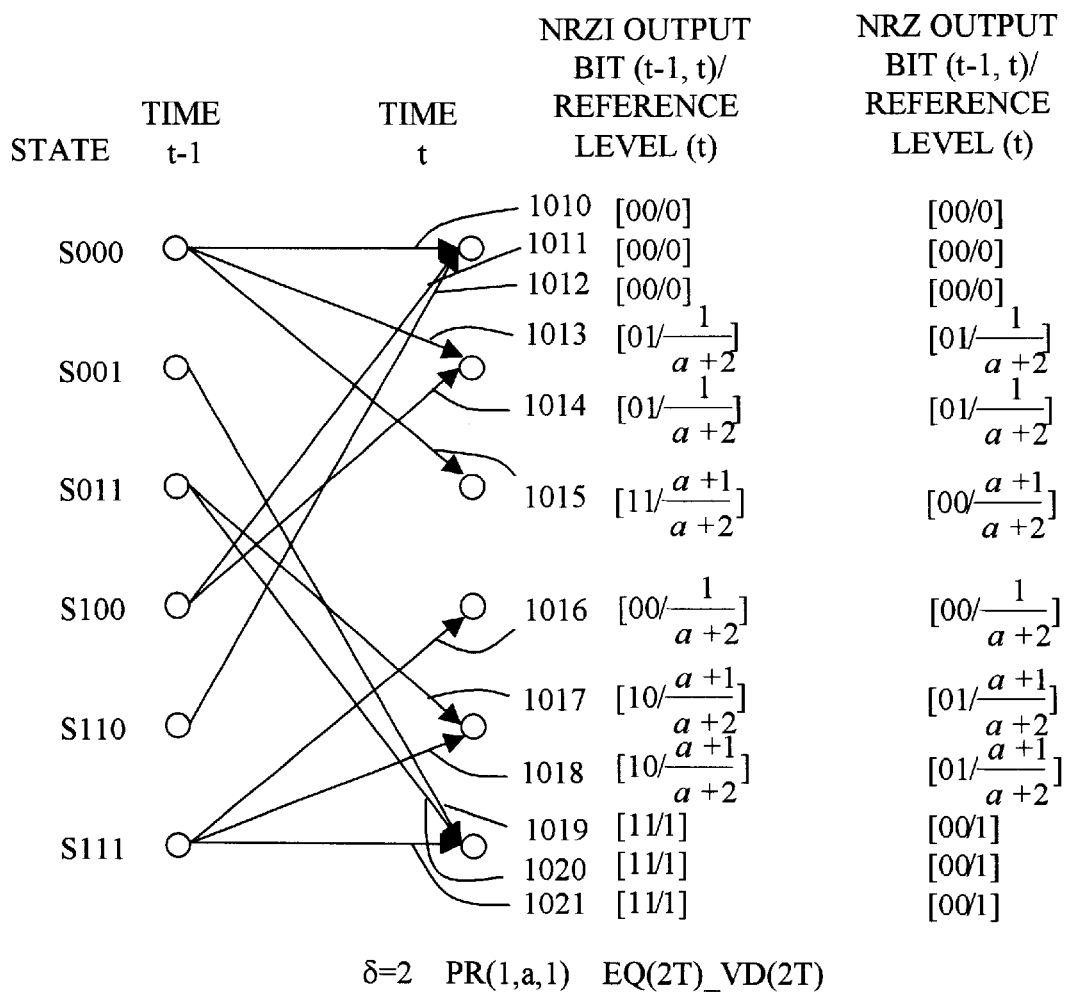
Figure 12A:
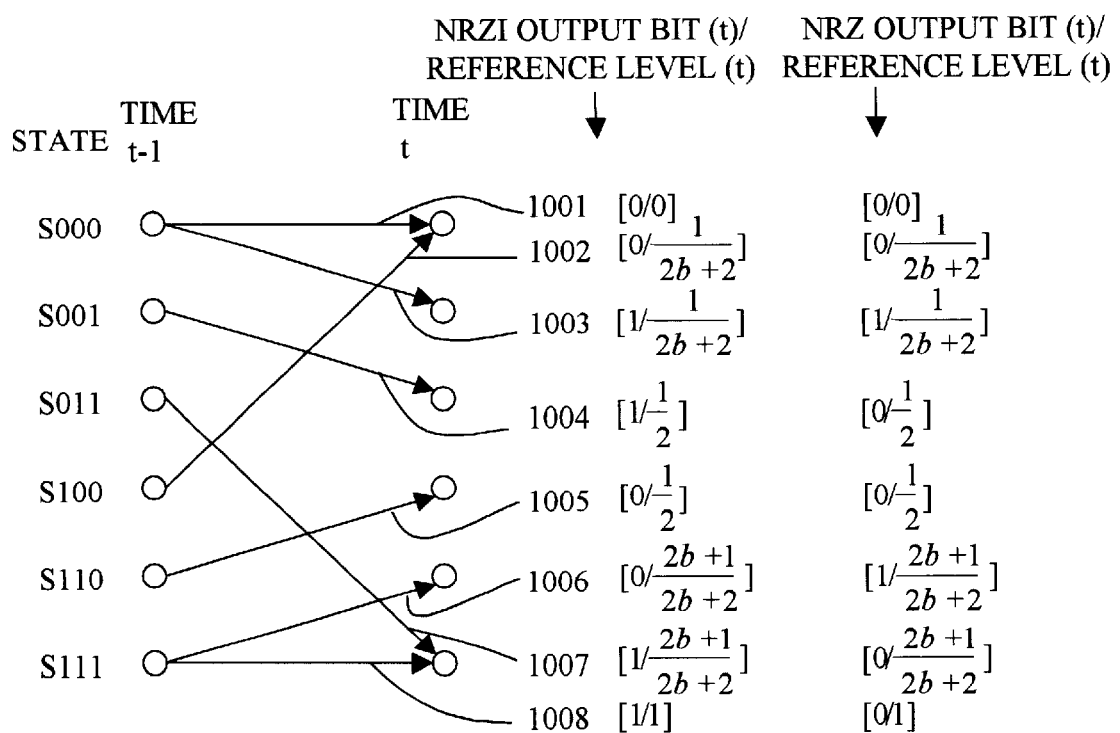
FIGS. 12A–12C is a trellis diagram associating with a Viterbi detector for PR(1, b, b, 1) equalization.
Figure 12B:
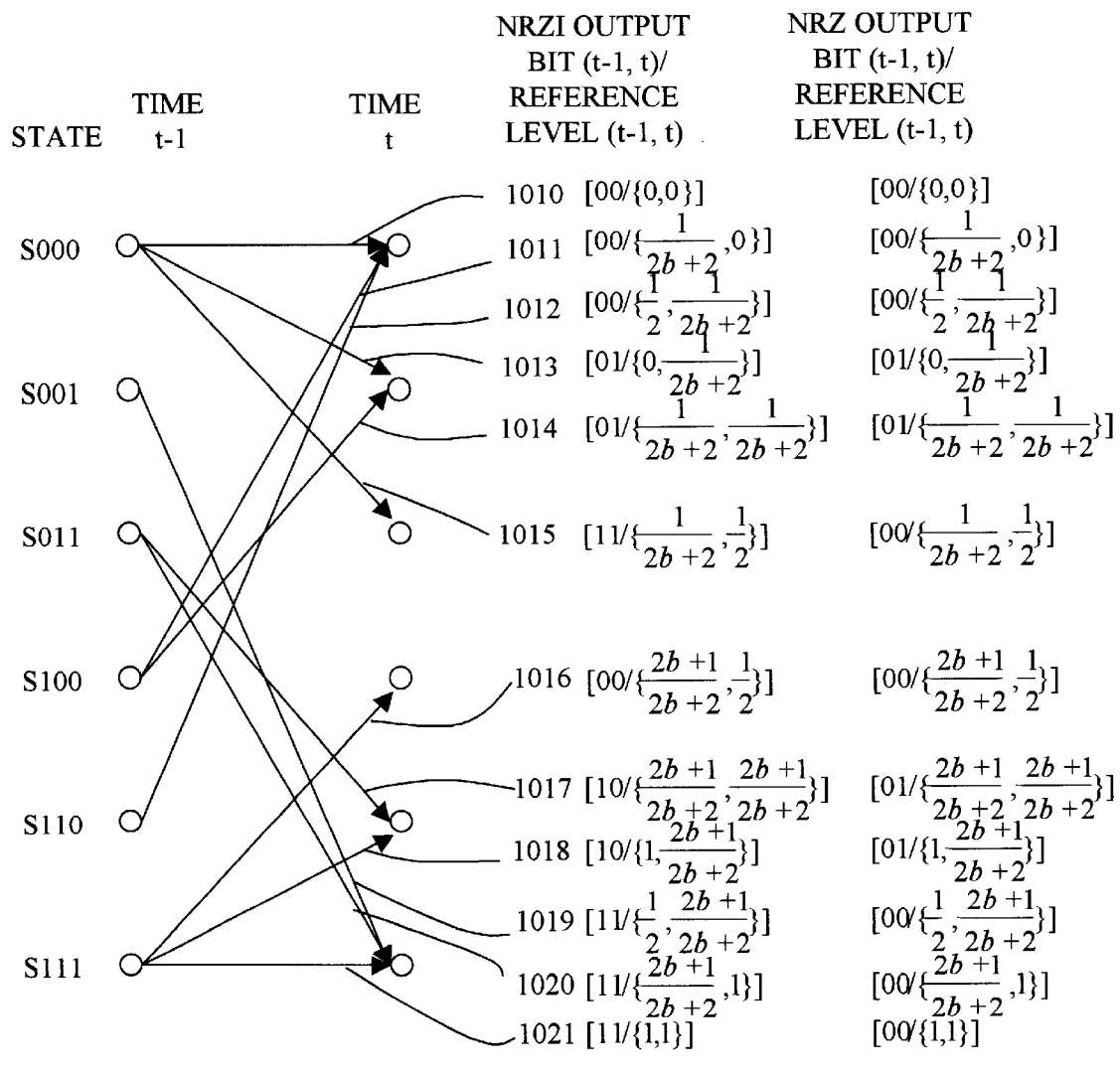
Figure 12C:
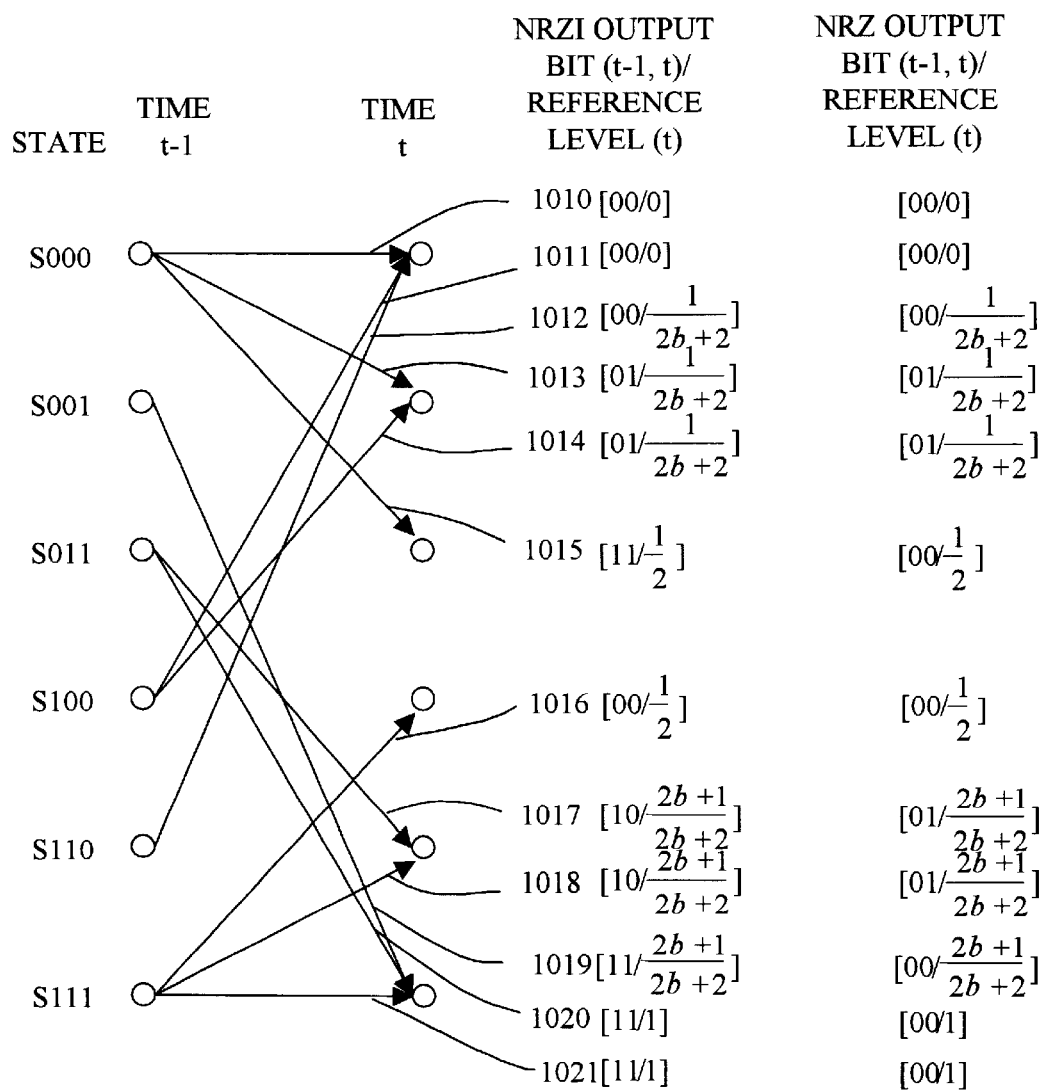
Figure 13A:
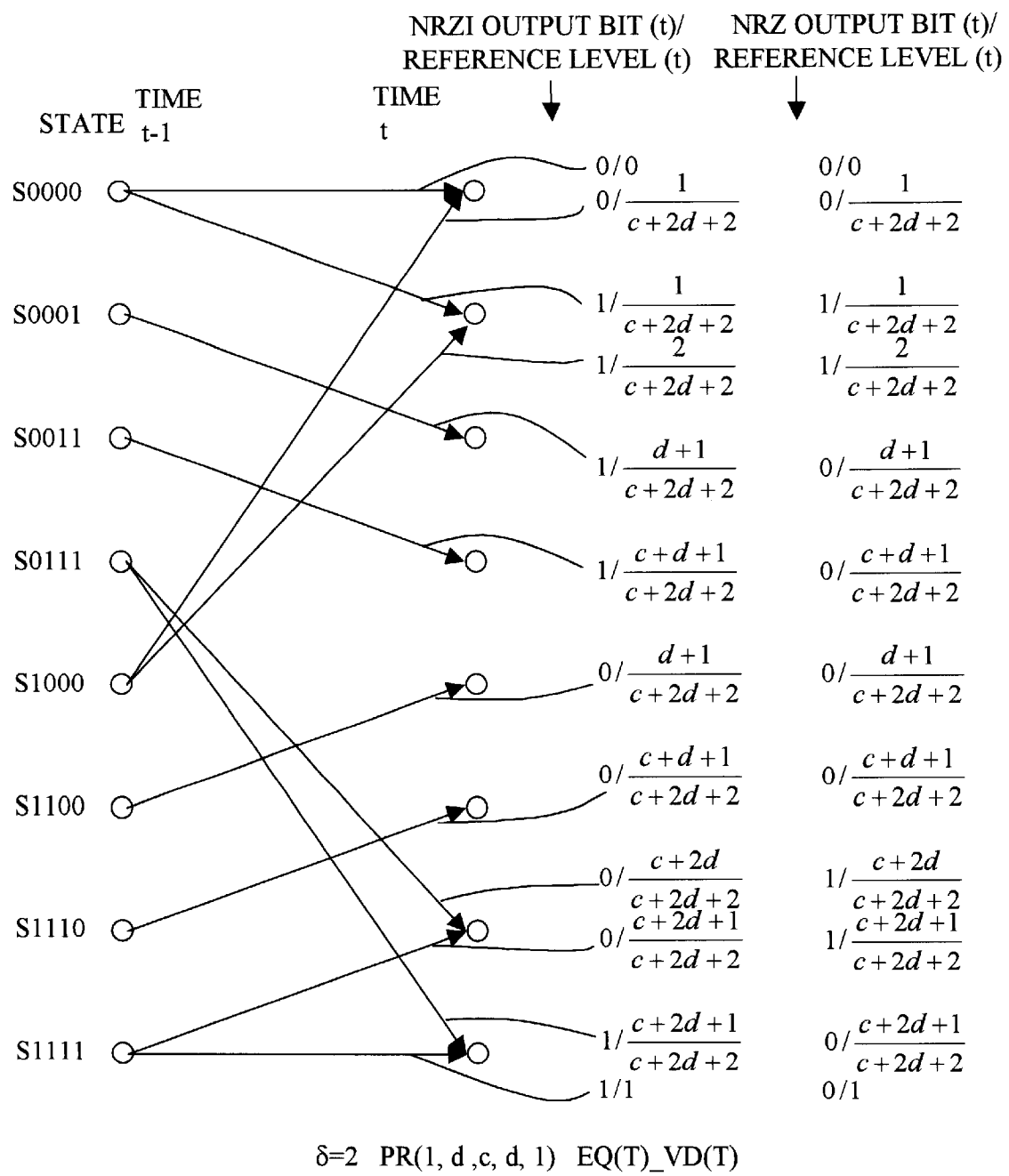
FIGS. 13A–13C is a trellis diagram associating with a Viterbi detector for PR(1, d, c, d, 1) equalization.
Figure 13B:
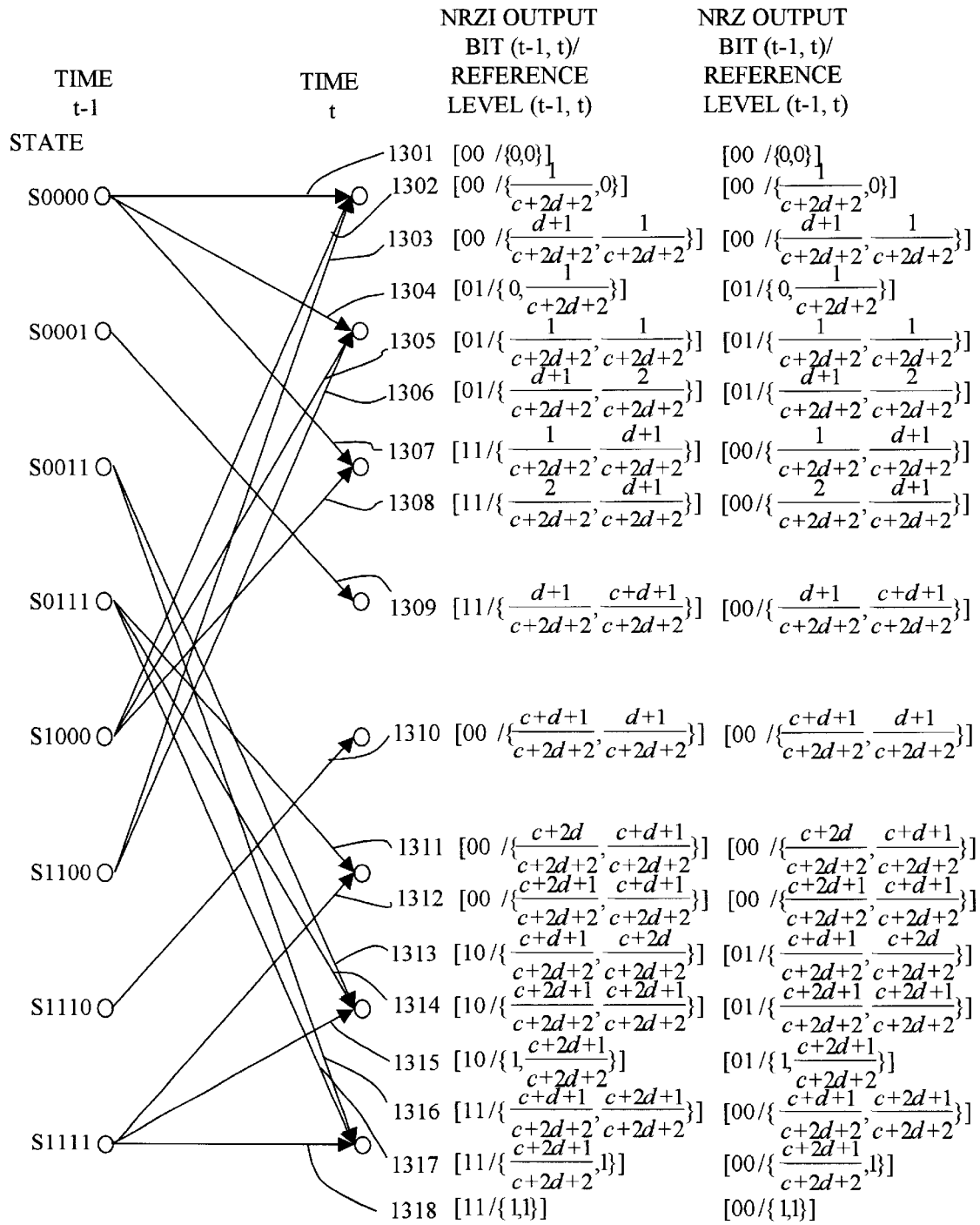
Figure 13C:
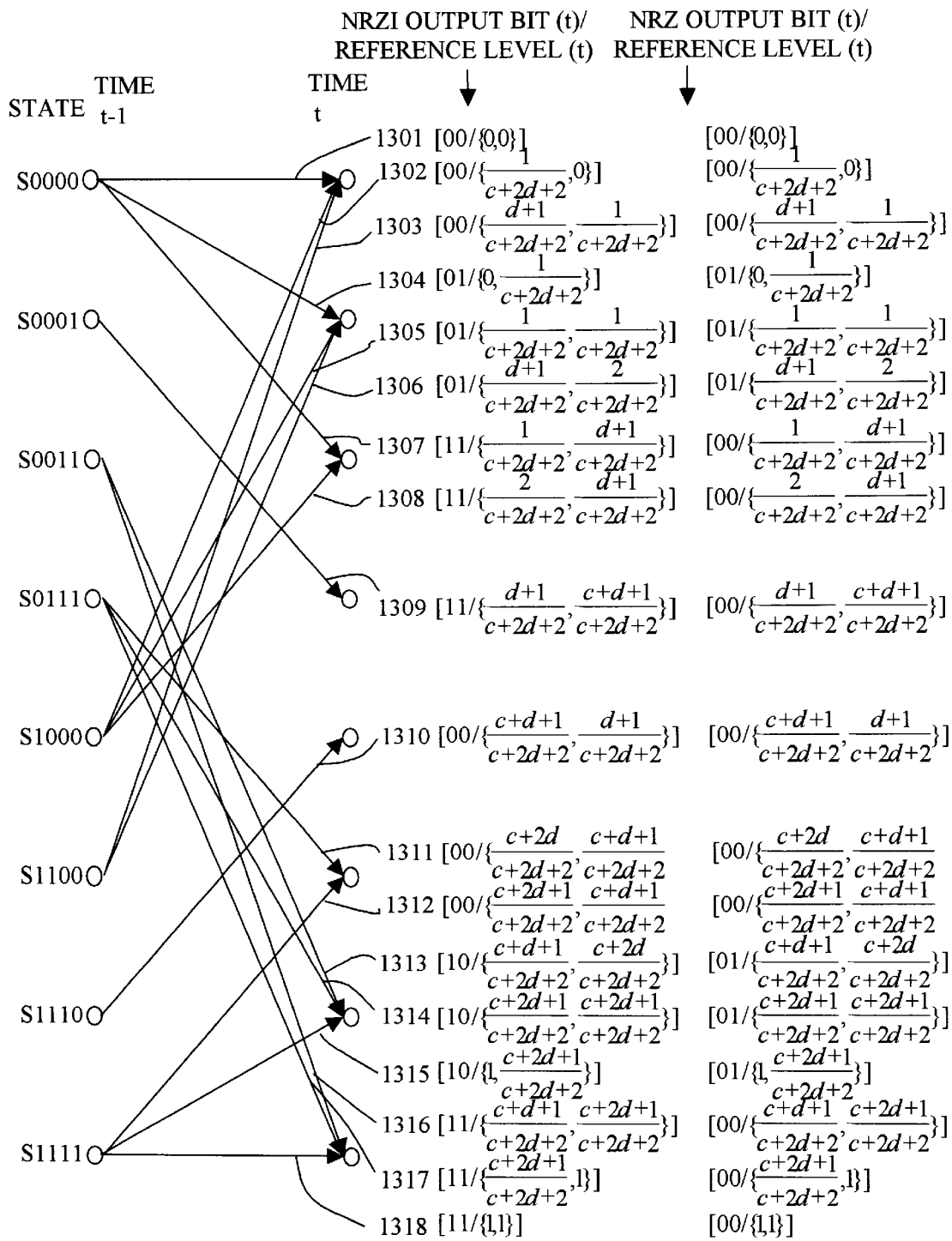

By the current techniques, one can obtain that the trellis diagrams associated with the Viterbi detector for PR(1, 1) equalization are shown in FIGS. 10A–10C; the trellis diagrams associated with the Viterbi detector for PR(1, a, 1) equalization are shown in FIGS. 11A–11C; the trellis diagrams associated with the Viterbi detector for PR(1, b, b, 1) equalization are shown in FIGS. 12A–12C; and the trellis diagrams associated with the Viterbi detector for PR(1, d, c, d, 1) equalization are shown in FIGS. 13A–13C. In addition, FIGS. 10A, 11A, 12A, and 13A are the trellis diagrams of the reproduction signal processing unit operating in EQ(T)_VD(T) mode; FIGS. 10B, 11B, 12B, and 13B are the trellis diagrams of the reproduction signal processing unit operating in EQ(T)_VD(2T) mode; and FIGS. 10C, 11C, 12C, and 13C are the trellis diagrams of the reproduction signal processing unit operating in EQ(2T)_VD(2T) mode.

Besides, reference levels of PR(1, 1) equalization are calculated, for example, by $(1 \cdot p + 1 \cdot q)/(1+1)$ if NRZI input signal F has values p and q, denoted as (p, q), at times t−1 and t, denoted as (t−1, t), respectively. For PR(1, a, 1) equalization, the reference levels are calculated, for example, by $(1 \cdot p + a \cdot q + 1 \cdot r)/(1+a+1)$ if NRZI input signal F has values (p, q, r) at times (t−2, t−1, t) respectively. For PR(1, b, b, 1) equalization, the reference levels are calculated, for example, by $(1 \cdot p + b \cdot q + b \cdot r + 1 \cdot s)/(1+b+b+1)$ if NRZI input signal F has values (p, q, r, s) at times (t−3, t−2, t−1, t) respectively. As for the reference levels of PR(1, c, d, c, 1) equalization, they are calculated, for example, by $(1 \cdot p + c \cdot q + d \cdot r + c \cdot s + 1 \cdot t)/(1+c+d+c+1)$ if NRZI input signal F has values (p, q, r, s, t) at times (t−4, t−3, t−2, t−1, t) respectively. In the description above, p, q, r, s, and t take binary values, either 0 and 1.

In order to implement a circuitry to realize the above-mentioned four partial response equalizations, PR(1, 1), PR(1, a, 1), PR(1, b, b, 1), and PR(1, d, c, d, 1), and the operation modes of the reproduction signal processing unit, EQ(T)_VD(T), EQ(T)_VD(2T), and EQ(2T)_VD(2T) modes, the approaches to the integration of the equalizations with different parameters and operating modes with different sampling rates are described as follows.

First, by changing the input terminal $P_t$ of the Viterbi detector for EQ(T)_VD(T) mode to two parallel input terminals ($P_{t-1}$, $P_t$) as well as by doubling the clock frequency, the Viterbi detector becomes a Viterbi detector for EQ(T)_VD(2T) mode. In this way, an identical circuit structure of the Viterbi detector can be implemented for EQ(T)_VD(T) and EQ(T)_VD(2T) modes.

For instance, the Viterbi detector for PR(1, 1) in EQ(T)_VD(T) mode is described as follows. In FIG. 10A, output bits at time t and reference levels at time t are indicated following branch (000, 000) 1001, branch (100, 000) 1002, branch (000, 001) 1003, branch (001, 011) 1004, branch (110, 100) 1005, branch (111, 110) 1006, branch (011, 111) 1007, and branch (111, 111) 1008. By changing the input terminal $P_t$ of the Viterbi detector for EQ(T)_VD(T) mode to two parallel input terminals ($P_{t-1}$, $P_t$), the Viterbi detector for PR(1, 1) in EQ(T)_VD(T) mode has the trellis diagram as shown in FIG. 10B. In FIG. 10B, output bits (t−1, t), that is, output bits at times t−1 and t, and reference levels (t−1, t) are indicated following branch (000, 000) 1010, branch (100, 000) 1011, branch (110, 000) 1012, branch (000, 001) 1013, branch (100, 001) 1014, branch (000, 011) 1015, branch (111, 100) 1016, branch (011, 110) 1017, branch (111, 110) 1018, branch (001, 111) 1019, branch (011, 111) 1020, and branch (111,111) 1021. In addition, these branches are associated with branch metrics $B000_1$, $B000_2$, $B000_3$, $B001_1$, $B001_2$, $B011_1$, $B100_1$, $B110_1$, $B110_2$, $B111_1$, $B111_2$, and $B111_3$ respectively.

Likewise, by changing the input terminal $P_t$ of the Viterbi detector for EQ(T)_VD(T) mode to two parallel input terminals ($P_{t-1}$, $P_t$), the Viterbi detector for PR(1, a, 1) in EQ(T)_VD(T) mode has the trellis diagram as shown in FIG. 11B. By changing the input terminal $P_t$ of the Viterbi detector for EQ(T)_VD(T) mode to two parallel input terminals ($P_{t-1}$, $P_t$), the Viterbi detector for PR(1, b, b, 1) in EQ(T)_VD(T) mode has the trellis diagram as shown in FIG. 12B. By changing the input terminal $P_t$ of the Viterbi detector for EQ(T)_VD(T) mode to two parallel input terminals ($P_{t-1}$, $P_t$), the Viterbi detector for PR(1, d, c, d, 1) in EQ(T)_VD(T) mode has the trellis diagram as shown in FIG. 13B.

Figure 14:
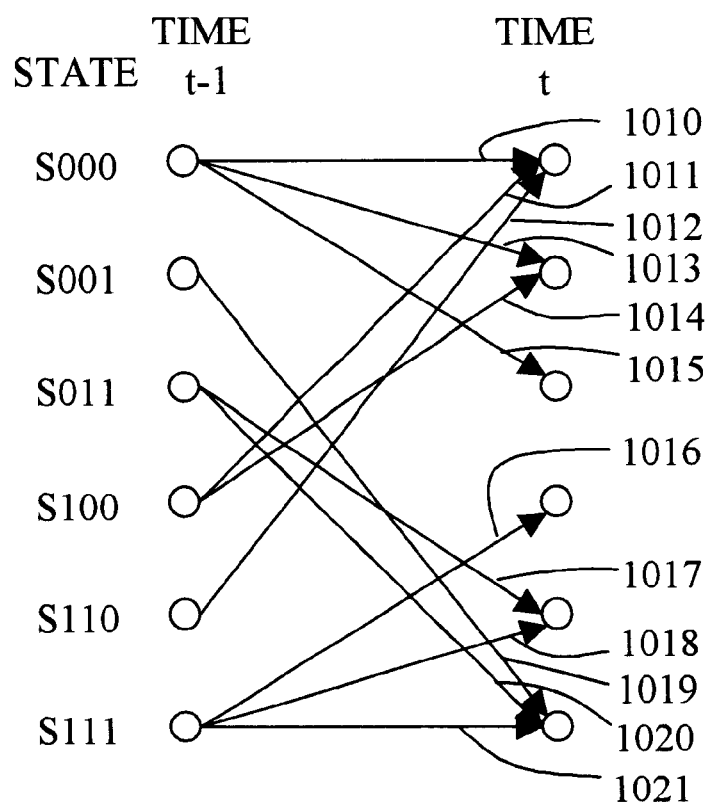
FIG. 14 is a trellis diagram merging the trellis diagrams for PR(1, 1), PR(1, a, 1), and PR(1, b, b, 1) equalization in EQ(T)_VD(2T) and EQ(2T)_VD(2T) modes.

After that, by examining FIGS. 10B, 10C, 11B, 11C, 12B, and 12C, it is obvious that the trellis diagrams of PR(1, 1), PR(1, a, 1), and PR(1, b, b, 1) equalizations in EQ(T)_VD(T) and EQ(T)_VD(2T) modes have the branches that indicate the identical relation of states at time t−1 and states at time t. Therefore, these Figures can be emerged for indicating the identical relation, as shown in FIG. 14. As for the output bits (t−1, t) and either reference levels (t−1, t) or reference level (t) for each branch of the equalization with different parameters and different mode, one can refer to FIGS. 15A–15B. FIGS. 15A–15B are associated with FIG. 14 and indicates the output bits and reference levels of NRZI andNRZ for each branch of PR(1, 1), PR(1, a, 1), and PR(1, b, b, 1) equalizations in EQ(T)_VD(T) and EQ(T)_VD(2T) modes.

Since the trellis diagrams for PR(1, 1), PR(1, a, 1), and PR(1, b, b, 1) equalizations in EQ(T)_VD(T) and EQ(T)_VD(2T) modes can be merged as shown in FIG. 14, in the regard of the application of the Viterbi detector, the add-select-compare circuit and path memory unit can be used in common. Thus, the branch metric calculation circuit is capable of generating branch metrics by using the relation between the reference levels and branch metrics in different equalizations and modes according to FIG. 15. In this way, PR(1, 1), PR(1, a, 1), and PR(1, b, b, 1) equalizations in EQ(T)_VD(T) and EQ(T)_VD(2T) modes can use a Viterbi detector in common.

Figure 16:
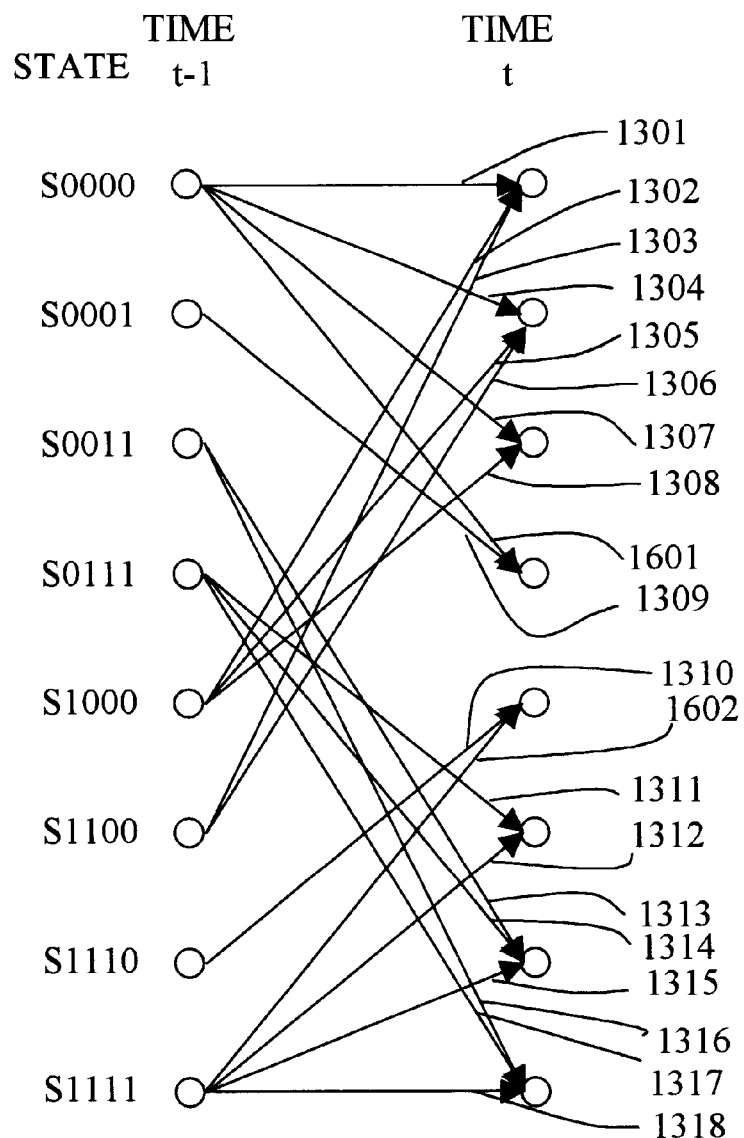
FIG. 16 is a trellis diagram obtained by using FIGS. 13B, 13C, and the trellis diagram in FIG. 14 after comparison, merging, and modifying.

Moreover, FIGS. 13B and 13C, and the trellis diagram as shown in FIG. 14 are compared for the determination of the union of them. As shown in FIGS. 13B and 13C, the output signal J' of the PR equalizer after PR(1, d, c, d, 1) equalization has eight states:S0000, S0001, S0011, S0111, S1000, S1100, S1110, and S1111. The output bits (t−1, t) and either reference levels (t−1, t) or reference level (t) are indicated following branch (0000, 0000) 1301, branch (1000, 0000) 1302, branch (1100, 0000) 1303, branch (0000, 0001) 1304, branch (1000, 0001) 1305, branch (1100, 0001) 1306, branch (0000, 0011) 1307, branch (1000, 0011) 1308, branch (0001, 0111) 1309, branch (1110, 1000) 1310, branch (0111, 1100) 1311, branch (1111, 1100) 1312, branch (0011, 1110) 1313, branch (0111, 1110) 1314, branch (1111, 1110) 1315, branch (0011, 1111) 1316, branch (0111, 1111) 1317, and branch (1111, 1111) 1318 respectively. In FIG. 14, state S000 is associated with states S0000 and S0001 in FIGS. 13B and 13C; state S001 is associated with states S0011 in FIGS. 13B and 13C; state S011 is associated with states S0111 in FIGS. 13B and 13C; state S100 is associated with states S1000 in FIGS. 13B and 13C; state S110 is associated with states S1110 in FIGS. 13B and 13C; and state S111 is associated with states S1110 and S1111 in FIGS. 13B and 13C. In this way, by comparing FIGS. 13B, 13C, and the trellis diagram in FIG. 14, merging them, and making modifications, FIG. 16 is obtained. In FIG. 16, there includes branches 1601 and 1602 as well as branches identical to branches 1301 and 1318 in FIGS. 13B and 13C. Associated with FIG. 16, FIGS. 17A–17B are tables indicating the output bits and reference levels of NRZI and NRZ for all branches of PR(1, 1), PR(1, a, 1), PR(1, b, b, 1), and PR(1, c, d, c, 1) equalizations in EQ(T)_VD(T) and EQ(T)_VD(2T) modes.

Besides, branch (0000, 0000) 1301, branch (1000, 0000) 1302, branch (1100, 0000) 1303, branch (0000, 0001) 1304, branch (1000, 0001) 1305, branch (1100, 0001) 1306, branch (0000, 0011) 1307, branch (1000, 0011) 1308, branch (0001, 0111) 1309, branch (1110, 1000) 1310, branch (0111, 1100) 1311, branch (1111, 1100) 1312, branch (0011, 1110) 1313, branch (0111, 1110) 1314, branch (1111, 1110) 1315, branch (0011, 1111) 1316, branch (0111, 1111) 1317, and branch (1111, 1111) 1318 are associated with branch metrics $B0000_1$, $B0000_2$, $B0000_3$, $B0001_1$, $B0001_2$, $B0001_3$, $B0011_1$, $B0011_2$, $B0111_1$, $B0111_2$, $B1000_1$, $B1000_2$, $B1100_1$, $B1100_2$, $B1110_1$, $B1110_2$, $B1110_3$, $B1111_1$, $B1111_2$, and $B1111_3$ respectively.

Figure 17A:
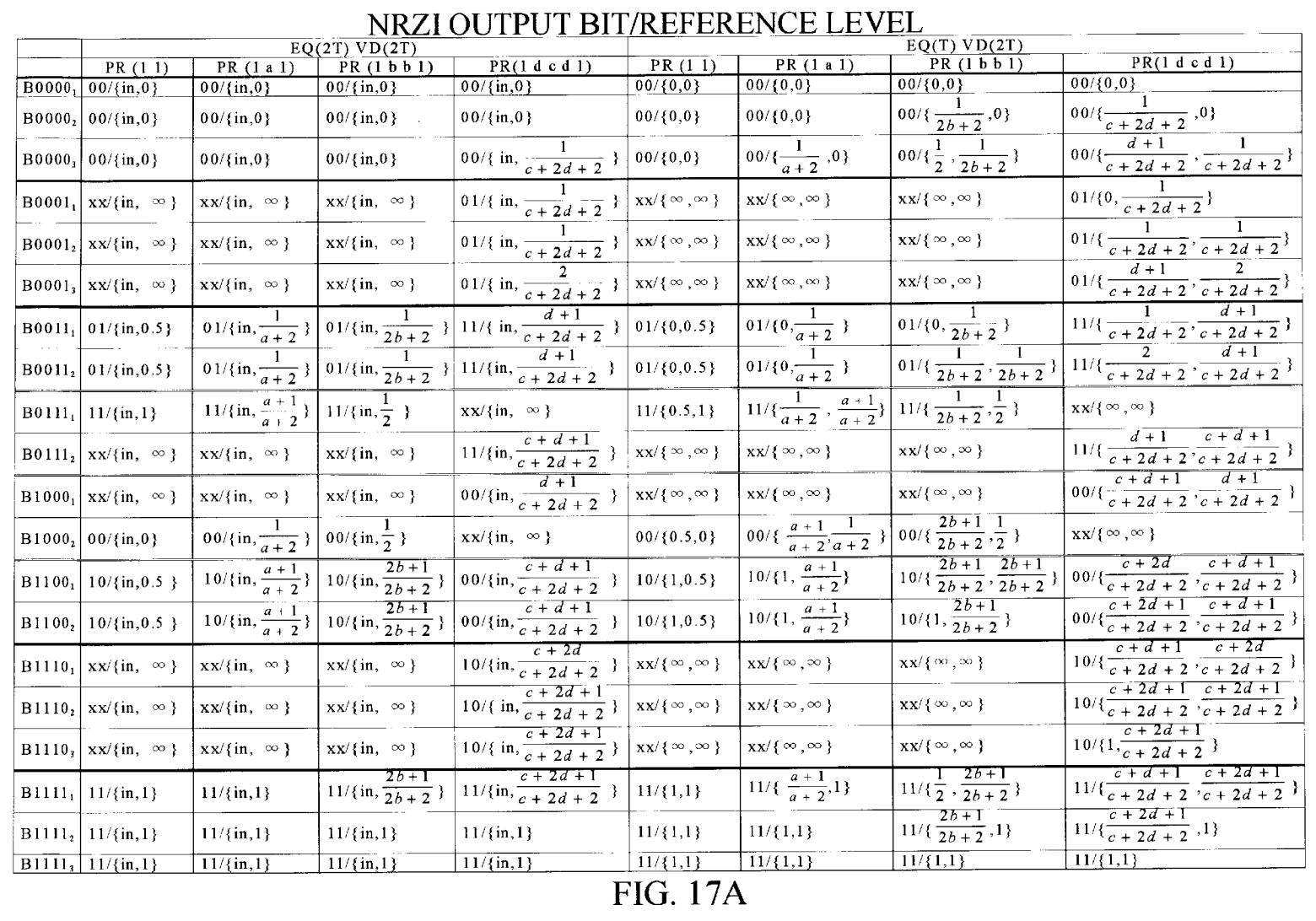

In FIGS. 17A–17B, "in" indicates that the reference level is to be make equal to the input voltage; thus, the corresponding branch metric is to be zero and is negligible. When the reference level is set to infinity "∞", the corresponding branch metric by calculation is to be infinity. Thus, when the add-compare-select circuit is to select a path, such a path that would lead to infinity branch metric will never be selected. In this way, it indicates that the corresponding branches are not in existence. For the branch metrics $B0001_1$, $B0001_2$, $B0001_3$, $B1110_1$, $B1110_2$, and $B1110_3$ of PR(1, 1), PR(1, a, 1), and PR(1, b, b, 1) equalizations in EQ(T)_VD(2T) and EQ(2T)_VD(2T) modes, their corresponding reference levels are infinity. Therefore, it indicates that states S0001 and S1110 of PR(1, 1), PR(1, a, 1), and PR(1, b, b, 1) equalizations do not exist. If the non-existed branches and states of PR(1, 1), PR(1, a, 1), and PR(1, b, b, 1) equalizations are removed from FIGS. 17A–17B, FIGS. 17A–17B become the trellis diagram as shown in FIG. 14.

Similarly, for the branch metrics $B0111_1$ and $B1000_2$ of PR(1, c, d, c, 1) equalization in EQ(T)_VD(2T) and EQ(2T)_VD(2T) modes, their corresponding reference levels are infinity. Therefore, it indicates that branch (0000, 0111) and branch (1111, 1000) do not exist. If branch (0000, 0111) and branch (1111, 1000) are removed from FIGS. 17A and 17B, FIGS. 17A and 17B become the trellis diagram as shown in FIGS. 13B and 13C.

Figure 18:
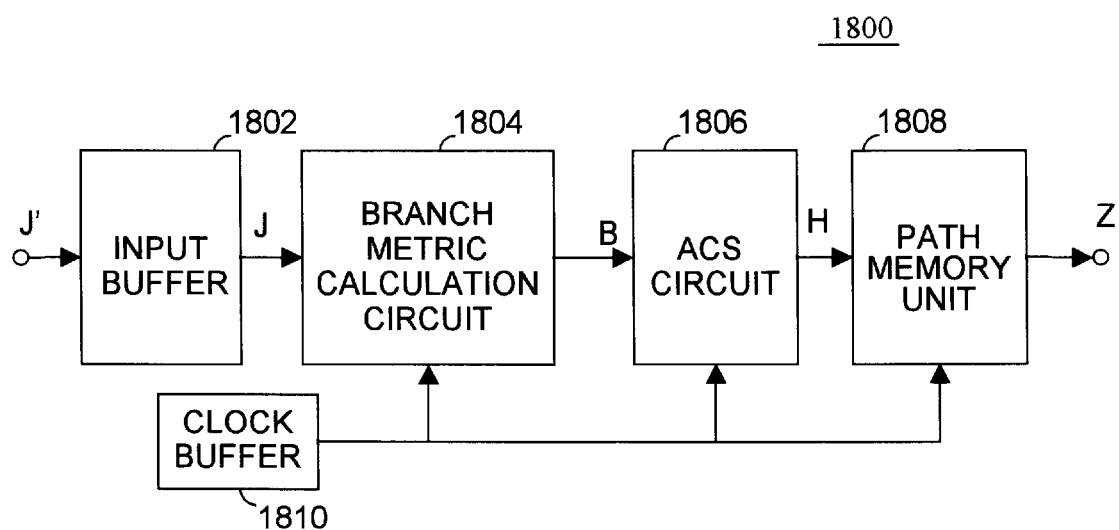
FIG. 18 is a block diagram of a Viterbi detector for PRML signal processing apparatus according to a preferred embodiment of the invention.

Referring to FIG. 18, it shows a Viterbi detector for PRML signal processing apparatus according to a preferred embodiment of the invention. In FIG. 18, a Viterbi detector 1800 includes an input buffer 1802, a branch metric calculation unit 1804, an add-compare-select (ACS) circuit 1806, a path memory unit 1808, and a clock buffer 1810. Viterbi detector 1800 receives the output signal J' of the PR equalizer. In Viterbi detector 1800, input buffer 1802 first processes the signal J', producing a parallel PR equalizer output signal J. The signal J is then as the input to branch metric calculation circuit 1804, resulting in a branch metric B. Next, ACS circuit 1806 obtains a path metric P by using the branch metric B, outputting a path control signal H. After that, path memory unit 1808 receives the branch control signal H and outputs a signal Z as the output signal of the Viterbi detector 1800. Besides, clock buffer 1810 is employed to adjust clock frequencies according to the requirement of different modes, providing branch metric calculation circuit 1804, ACS circuit 1806, and path memory unit 1808 with clock signals at appropriate frequencies.

Figure 19:
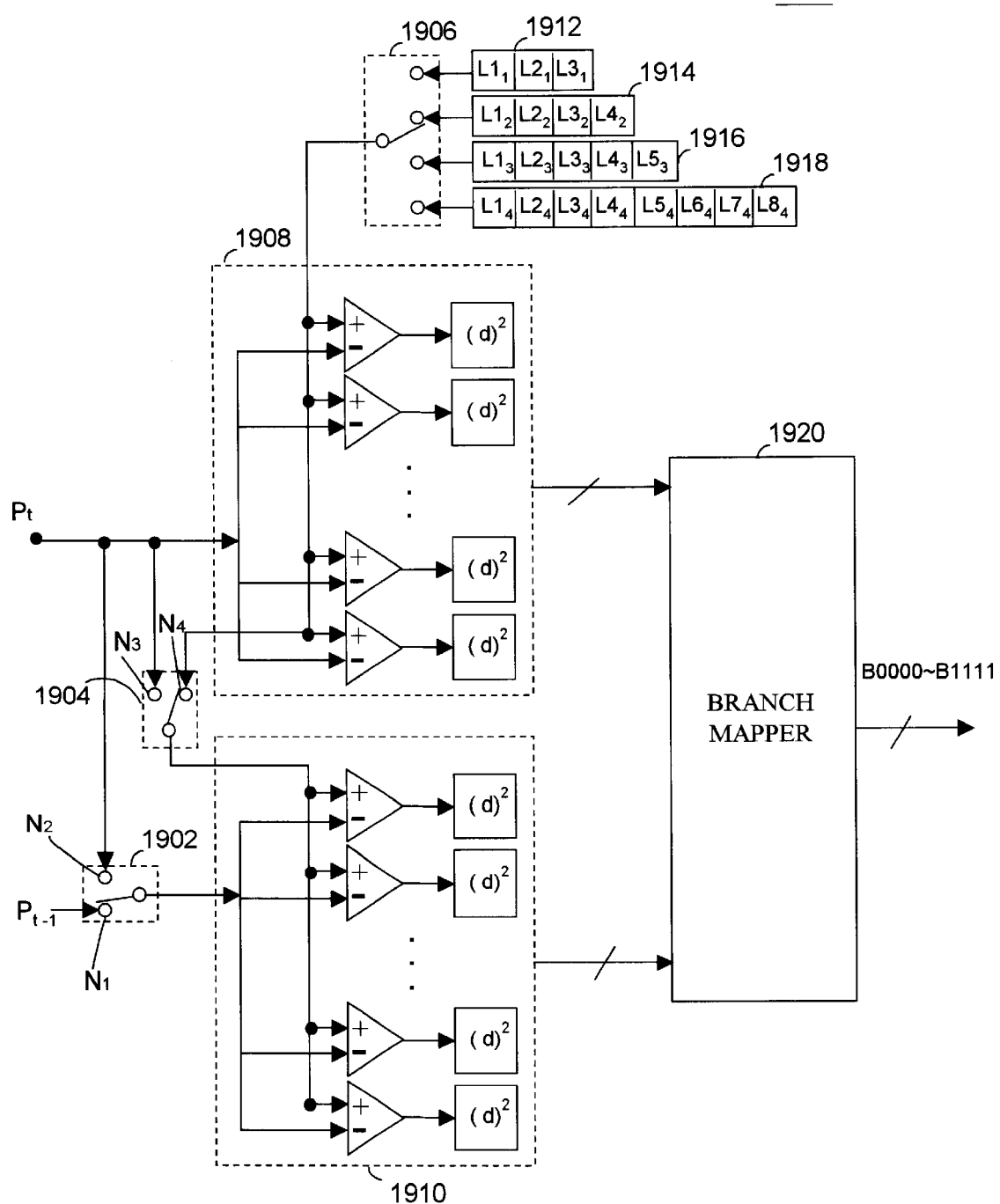
FIG. 19 is a structural block diagram illustrating the branch metric calculation circuit shown in FIG. 18.

Referring to FIG. 19, it shows a structural block diagram of branch metric calculation circuit 1804 in FIG. 18. As described above, the output signal J' of the PR equalizer, which is in a serial format, is converted into the output signal J of the PR equalizer in parallel by input buffer 1802. The signal J is then sent to branch metric calculation circuit 1804 through its input terminals $P_t$ and $P_{t-1}$ in parallel and respectively, wherein the signal J includes signal $J_t$ and $J_{t-1}$.

Figure 1:
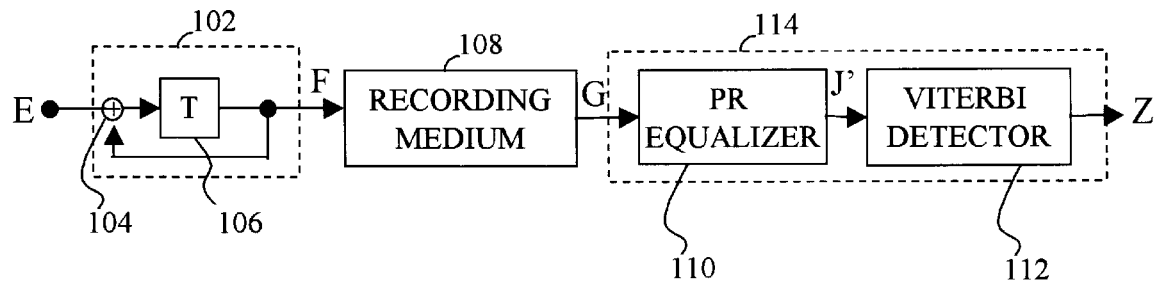
FIG. 1 (Prior Art) is a block diagram of an apparatus for PRML signal processing in ME recording format.
Figure 3:
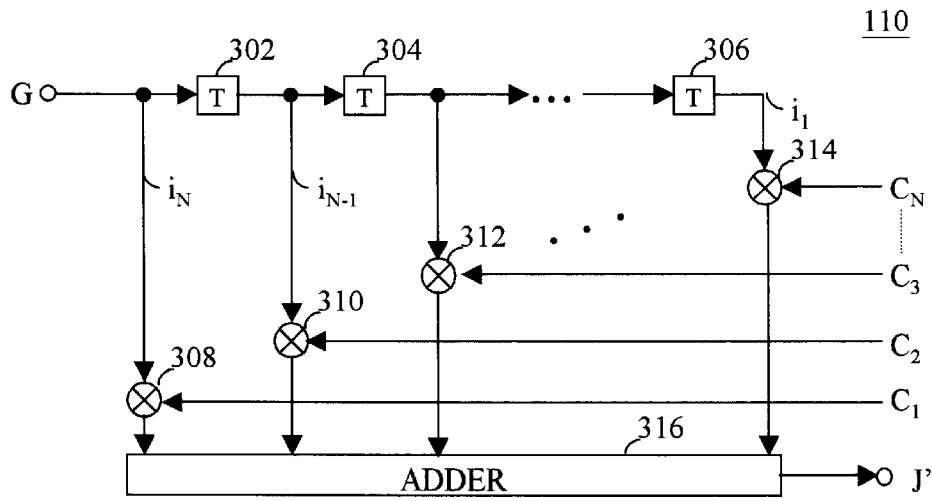
FIG. 3 (Prior Art) is a block diagram illustrating the conventional PR equalizer in FIG. 1.
Figure 4:
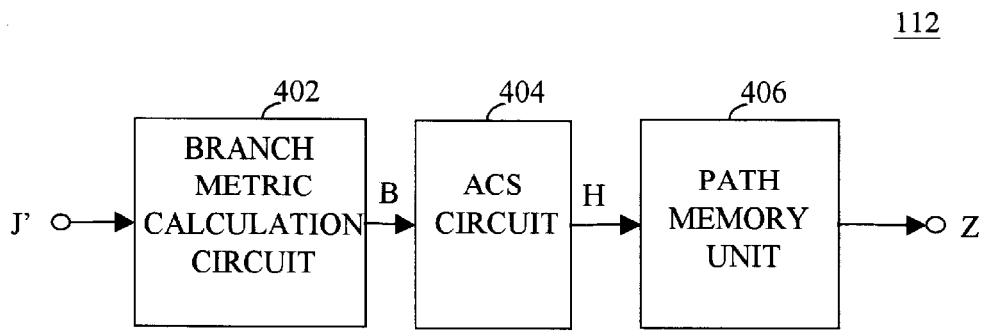
FIG. 4 (Prior Art) is a block diagram illustrating the Viterbi detector shown in FIG. 1.
Figure 2:
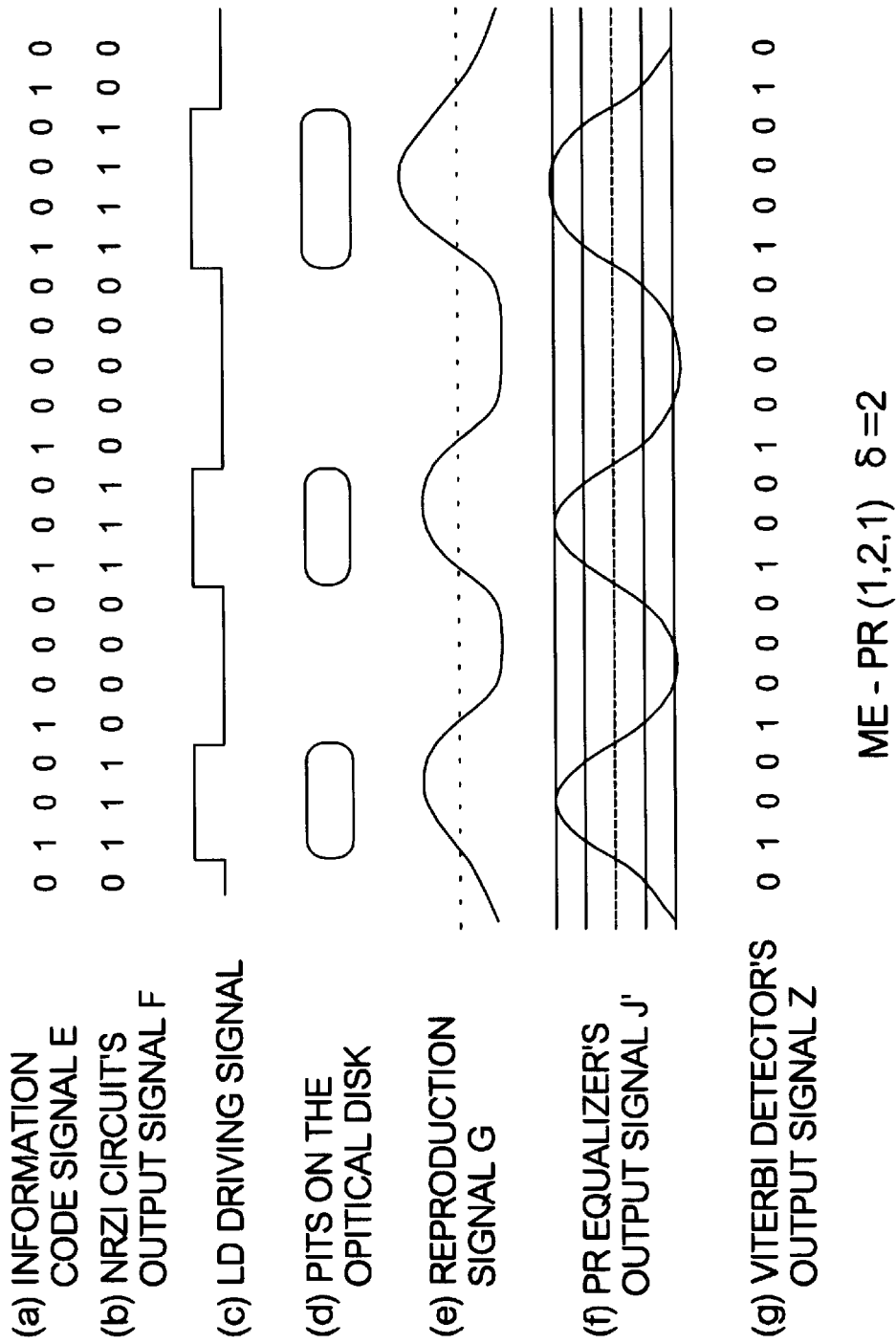
FIG. 2 (Prior Art) illustrates the waveforms of the signals shown in FIG. 1 and corresponding pits on an optical disk.
Figure 5:
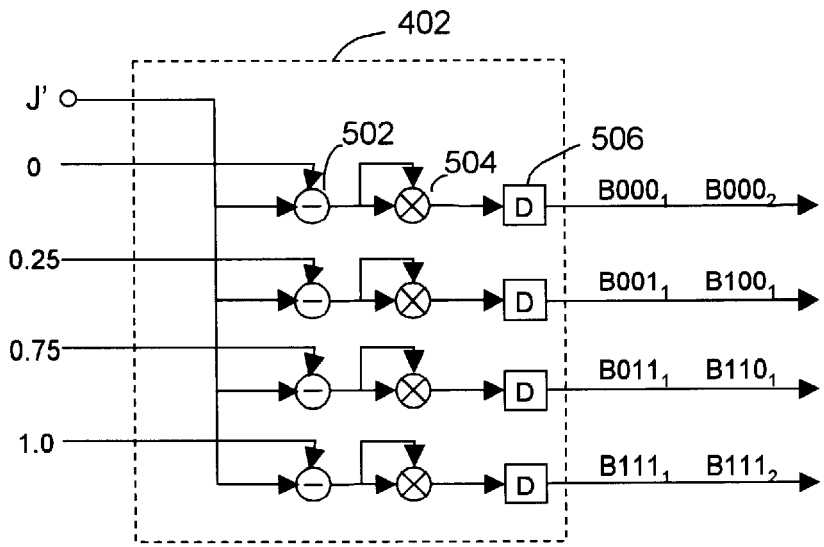
FIG. 5 (Prior Art) is a block diagram illustrating the branch metric calculation circuit shown in FIG. 4.
Figure 6:
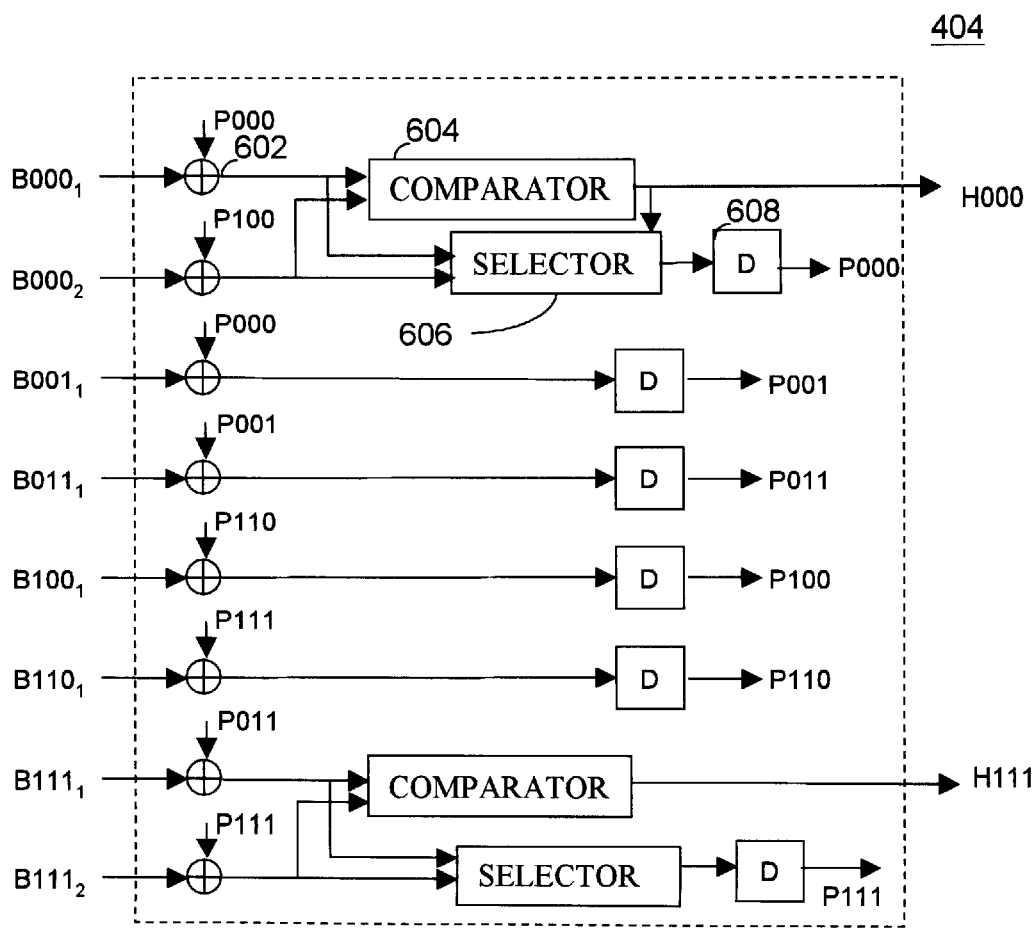
FIG. 6 (Prior Art) is a block diagram illustrating the ACS circuit shown in FIG. 4.
Figure 7:
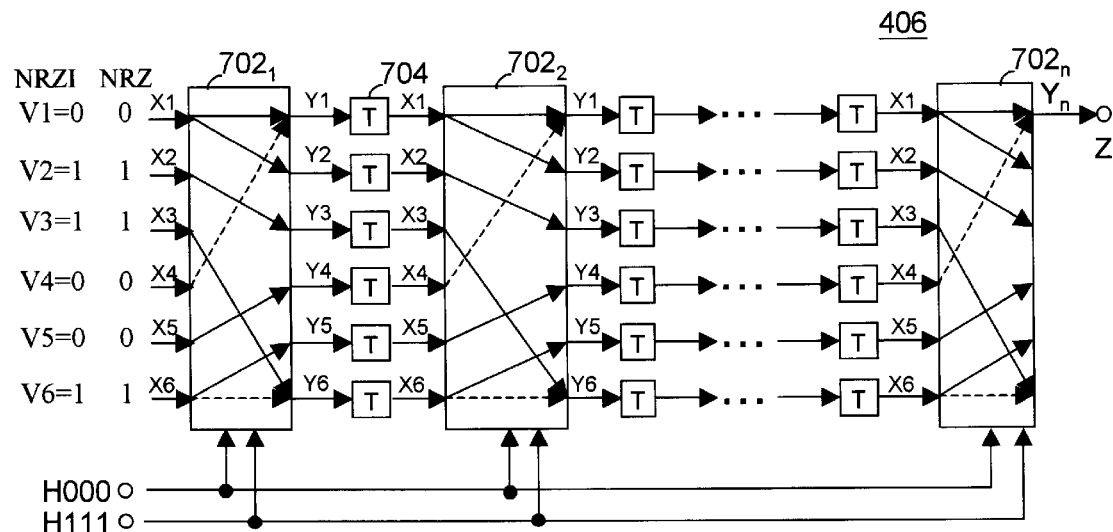
FIG. 7 (Prior Art) is a block diagram illustrating the path memory unit shown in FIG. 4.
Figures 8A, 8B:
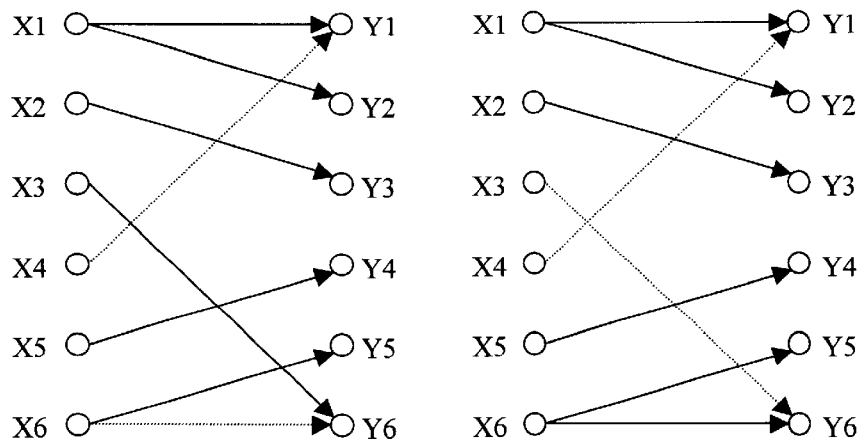
FIGS. 8A–8D (Prior Art) illustrate the connection and switching relation between inputs and outputs of the detection sequence switches shown in FIG. 7.
Figure 8C:
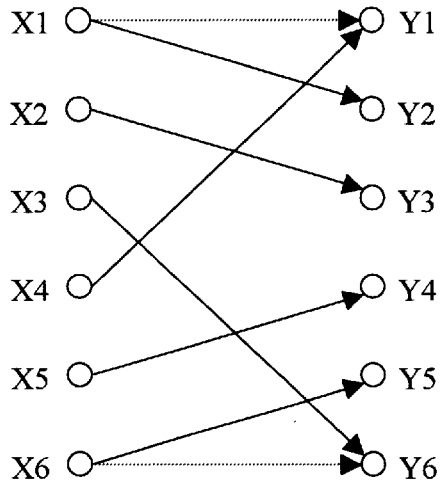
Figure 8D:
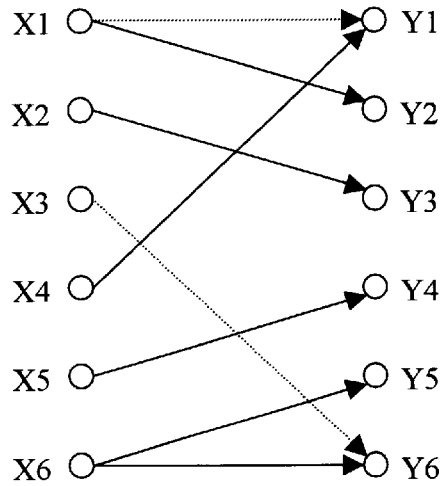
Figure 9:
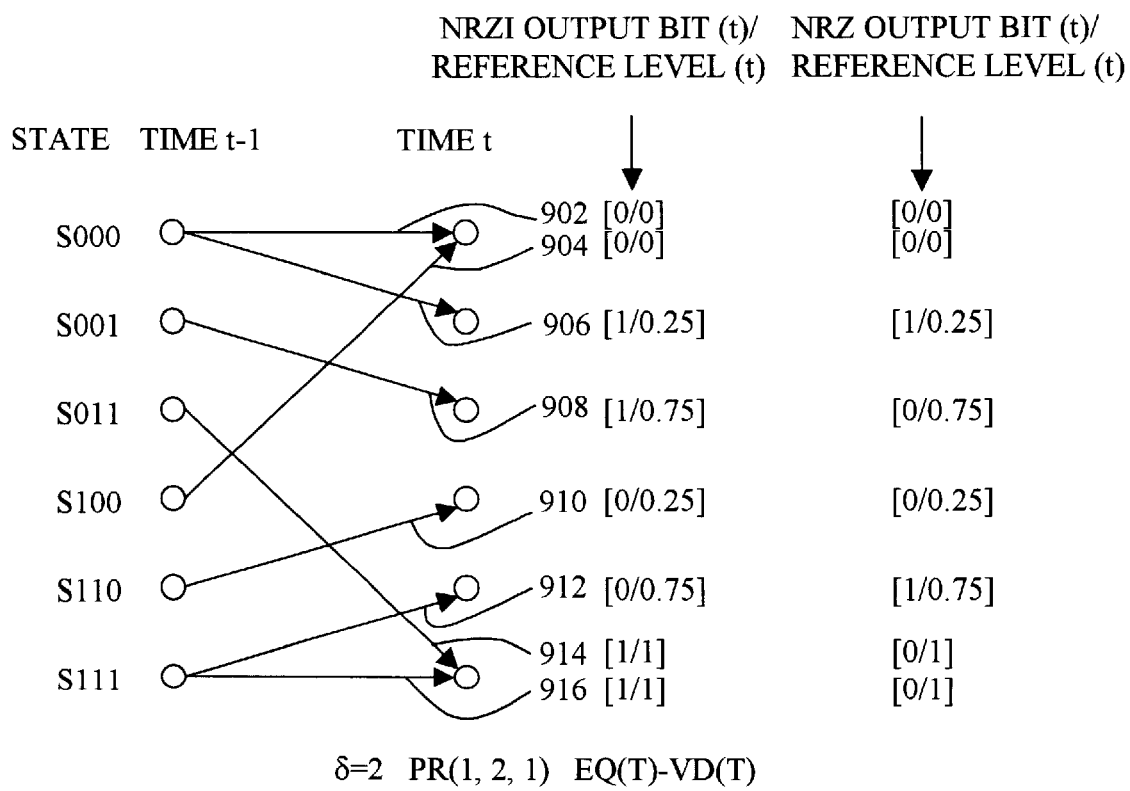
FIG. 9 (Prior Art) illustrates a trellis diagram of a signal level transition rule.

In either EQ(T)_VD(T) or EQ(T)_VD(2T) mode, an identical circuit is employed. Viterbi detector 1800 uses the two input terminals $P_t$ and $P_{t-1}$ and operates at a clock period two times the period used in the conventional approach illustrated in FIG. 1. In addition, every branch metrics from $B000_0$ to $B1111_3$ is equal to $(J_t-L_i)^2+(J_{t-1}-L_j)^2$, where $L_i$ and $L_j$ represent the respective reference levels at time t and time t−1 for the branch metrics of PR(1, 1), PR(1, a, 1), PR(1, b, b, 1), and PR(1, c, d, c, 1) equalizations in EQ(T)_VD(2T) mode shown in FIGS. 17A and 17B.

In FIG. 19, switch 1902 is switched to terminal N1 to connect with the input terminal $P_{t-1}$ while switch 1904 is switched to terminal N4 to connect with switch 1906. Switch 1906 is used to select one from reference level registers 1912, 1914, 1916, and 1918 according to an equalization operation to be performed, where the equalization operation can be PR(1, 1), PR(1, a, 1), PR(1, b, b, 1), or PR(1, c, d, c, 1). Reference level register 1912 stores the reference levels for PR(1, 1) equalization, and has values $L1_1=0$, $L2_1=0.5$, and $L3_1=1$. Reference level register 1914 stores the reference levels for PR(1, a, 1) equalization, and has values $L1_2=0$, $L2_2=1/(a+2)$, $L3_2=(a+1)/(a+2)$, and $L4_2=1$. Moreover, reference level registers 1916 and 1918 store the reference levels for PR(1, b, b, 1) and PR(1, c, d, c, 1) respectively. Similarly, values $L1_3$ to $L5_3$ and $L1_4$ to $L8_4$ that are stored in the reference level registers 1916 and 1918 respectively can be derived from FIGS. 17A and 17B. For the sake of brevity, they will not be described again.

The values stored in the one selected from reference level registers 1912, 1914, 1916, and 1918 are sent to a subtraction square calculation unit 1908 and a subtraction square calculation unit 1910 via switch 1904. In the subtraction square calculation unit, the squares of the differences between the signal $J_t$ and each reference level, and between the signal $J_{t-1}$ and each reference level are calculated for all reference levels. Then, the results are sent to a branch mapper 1920, where the branch mapper 1920 outputs branch metrics $B0000_1$ to $B1111_3$ shown in FIGS. 17A and 17B.

In EQ(T)_VD(2T) mode, only one input terminal $P_t$ is required. In this way, switches 1902 and 1904 are switched to terminals N2 and N3 respectively such that subtraction square calculation unit 1910 performs $J_t-J_t$, that is, it always outputs zero. Therefore, branch mapper 1920 only receives outputs from subtraction square calculation unit 1908. In addition, every branch metrics $B000_0$ to $B1111_3$ is equal to $(J_t-L_i)^2$, where $L_i$ represents the reference level at time t for the branch metric of PR(1, 1), PR(1, a, 1), PR(1, b, b, 1), and PR(1, c, d, c, 1) equalizations in EQ(2T)_VD(2T) mode shown in FIGS. 17A and 17B.

In FIG. 18, ACS circuit 1806 calculates path metrics P0000, P0001, P0011, P0111, P1000, P1100, P1110, and P1111, and outputs path control signal H0000, H0001, H0011, H0111, H1000, H1100, H1110, and H1111 by using the branch metrics $B000_0$ to $B1111_3$ obtained from branch metric calculation circuit 1804. In addition, the path metrics P0000, P0001, P0011, P0111, P1000, P1100, P1110, and P1111 have initial values of zero, and the path control signal H0000, H0001, H0011, H0111, H1000, H1100, H1110, and H1111 are calculated as follows:

H0000=0/1/2 if $P0000+B0000_1/P1000+B0000_2/P1100+B0000_3=\min\{P0000+B0000_1, P1000+B0000_2, P1100+B0000_3\}$;

H0001=0/1/2 if $P0000+B0001_1/P1000+B0001_2/P1100+B0001_3=\min\{P0000+B0001, P1000+B0001_2, P1100+B0001_3\}$;

H0011=0/1 if $P0000+B0011_1/P1000+B0011_2=\min\{P0000+B0011_1, P1000+B0011_2\}$;

H0111=0/1 if $P0000+B0111_1/P0001+B0111_2=\min\{P0000+B0111_1, P0001+B0111_2\}$;

H1000=0/1 if $P1110+B1000_1/P1111+B1000_2=\min\{P1110+B1000_1, P1111+B1000_2\}$;

H1100=0/1 if $P0111+B1100_1/P1111+B1100_2=\min\{P0111+B1100_1, P1111+B1100_2\}$;

H1110=0/1/2 if $P0011+B1110_1/P0111+B1110_2/P1111+B1110_3=\min\{P0011+B1110_1, P0111+B1110_2, P1111+B1110_3\}$; and H1111=0/1/2 if $P0011+B1111_1/P0111+B1111_2/P1111+B1111_3=\min\{P0011+B1111_1, P0111+B1111_2, P1111+B1111_3\}$.

After ACS 1806 outputs path control signals H0000, H0001, H0011, H0111, H1000, H1100, H1110, and H1111, ACS 1806 updates the path metrics P0000, P0001, P0011, P0111, P1000, P1100, P1110, and P1111 as follows:

P0000(t+1)=min{P0000(t)+$B0000_1$(t), P1000(t)+$B0000_2$(t), P1100(t)+$B0000_3$(t)};

P0001(t+1)=min{P0000(t)+$B0001_1$(t), P1000(t)+$B0001_2$(t), P1100(t)+$B0001_3$(t)};

P0011(t+1)=min{P0000(t)+$B0011_1$(t), P1000(t)+$B0011_2$(t)};

P0111(t+1)=min{P0000(t)+$B0111_1$(t), P0001(t)+$B0111_2$(t)};

P1000(t+1)=min{P1110(t)+$B1000_1$(t), P1111(t)+$B1000_2$(t)};

P1100(t+1)=min{P0111(t)+$B1100_1$(t), P1111(t)+$B1100_2$(t)};

P1110(t+1)=min{P0011(t)+$B1110_1$(t), P0111(t)+$B1110_2$(t), P1111(t)+$B1110_3$(t)}; and P1111(t+1)=min{P0011(t)+$B1111_1$(t), P0111(t)+$B1111_2$(t), P1111(t)+$B1111_3$(t)}.

Figure 20:
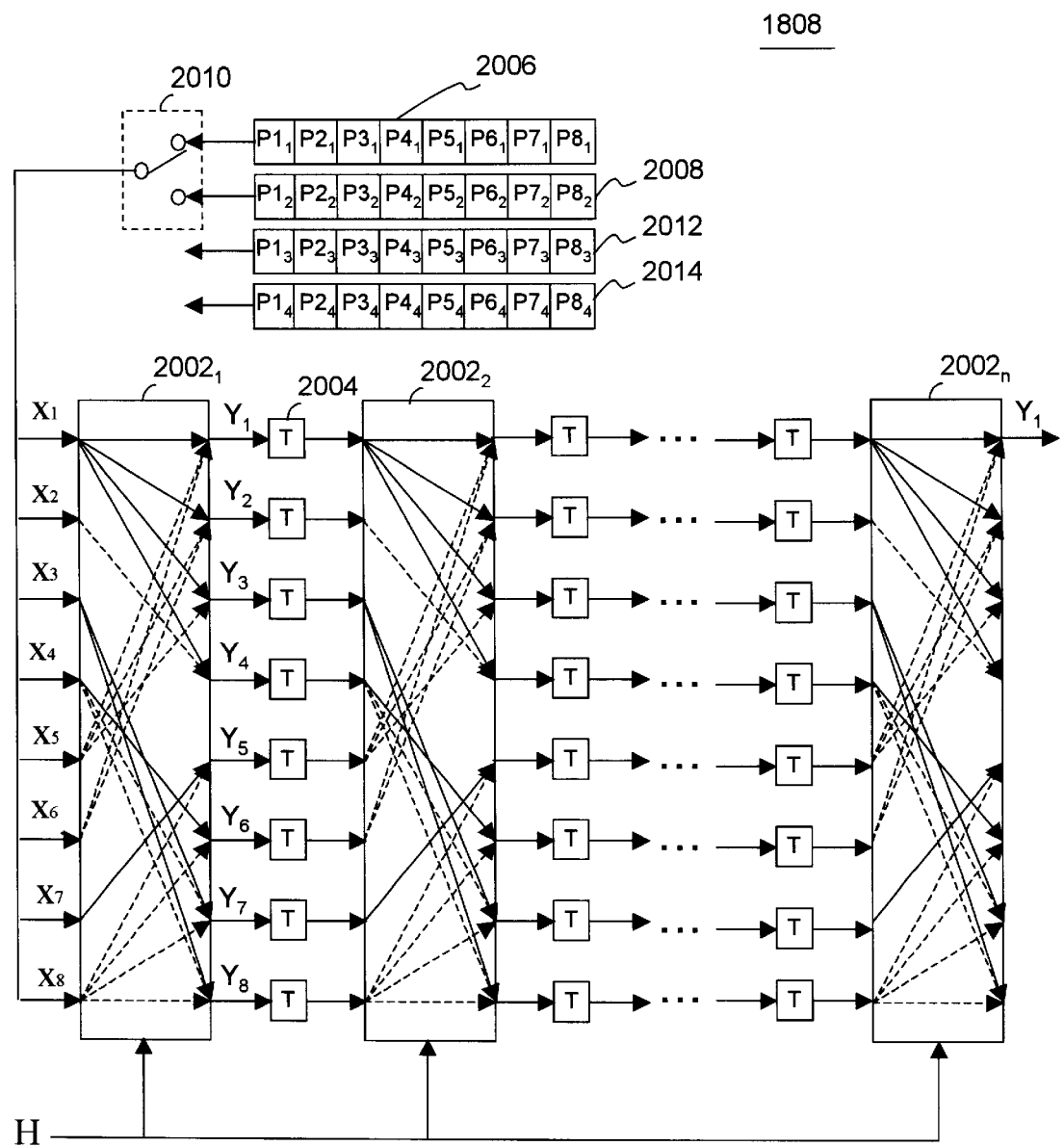
FIG. 20 is a structural block diagram illustrating the path metric calculation circuit shown in FIG. 18.

Referring to FIG. 20, it illustrates a circuit of path memory unit 1808. Path memory unit 1808 includes n detection sequence switches $2001_1$ to $2002_n$, and 8(n−1) delay units 2004. In addition, eight of the delay units are coupled between every two adjacent detection sequence switches. Moreover, path control signals H, including H0000, H0001, H0011, H0111, H1000, H1100, H1110, and H1111, are as inputs to the detection sequence switches. At each point of time, path memory unit 1808 is to output one bit of binary value.

As shown in FIGS. 17A and 17B, the branch metrics of PR(1, 1), PR(1, a, 1), PR(1, b, b, 1), and PR(1, c, d, c, 1) equalizations in EQ(2T)_VD(2T) and EQ(2T)_VD(2T) modes are associated with the output bits differently. Specifically, states B0000, B0001, B0011, B0111, B1000, B1100, B1110, and B1111 are associated with output bits (00, xx, 01, 11, 00, 10, xx, 1) of NRZI of PR(1,1), PR(1, a, 1), and PR(1, b, b, 1) equalizations respectively, as well as output bits (00, xx, 01, 00, 00,01, xx) of NRZI of PR(1, 1), PR(1, a, 1), and PR(1, b, b, 1) equalizations respectively. In addition, these states are associated with output bits (00, 01, 11, 11, 00, 00, 10, 11) of NRZI of PR(1, c, d, c, 1) equalization respectively as well as output bits (00, 01, 00, 00, 00, 00, 01, 00) of NRZ of PR(1, c, d, c, 1) equalization respectively. These relations of output bits and branch metrics are stored in registers 2006, 2008, 2012, and 2014 respectively. According to indicated equalization with different parameters, switch 2010 is to select one of the registers as the input signals of the input terminals X1 to X8 of detection sequence switch $2002_1$.

Referring again to FIG. 20, it illustrates detector sequence switches 2002 when path control signals (H0000, H0001, H0011, H0111, H1000, H1100, H1110, H1111)=(0, 0, 0, 0, 0, 0, 0, 0). In FIG. 20, the output terminal Y1 of detector sequence switch 2002n is used as the output of path memory unit 1808. In this way, the Viterbi detector obtains the NRZI or NRZ output signal Z of {0, 1}.

In FIG. 20, the connection in detector sequence switches 2002 is according to the trellis diagram as shown in FIG. 16, wherein path control signal H0000 is taken as an example. When P0000+B0000$_1$ is the minimum of P0000+B0000$_1$, P1000+B0000$_2$, and P1100+B0000$_3$, path control signal H0000 is set to 0 and is to indicate that branch B(0000, 0000) associated with B0000$_1$ is selected, and the input terminal X1 is connected to the output terminal Y1 for detector sequence switches 2002$_1$, to 2002$_n$. Likewise, the other path control signal is used to indicate the connection in each detector sequence switch. For the sake of brevity, the details are not described.

Figure 21:
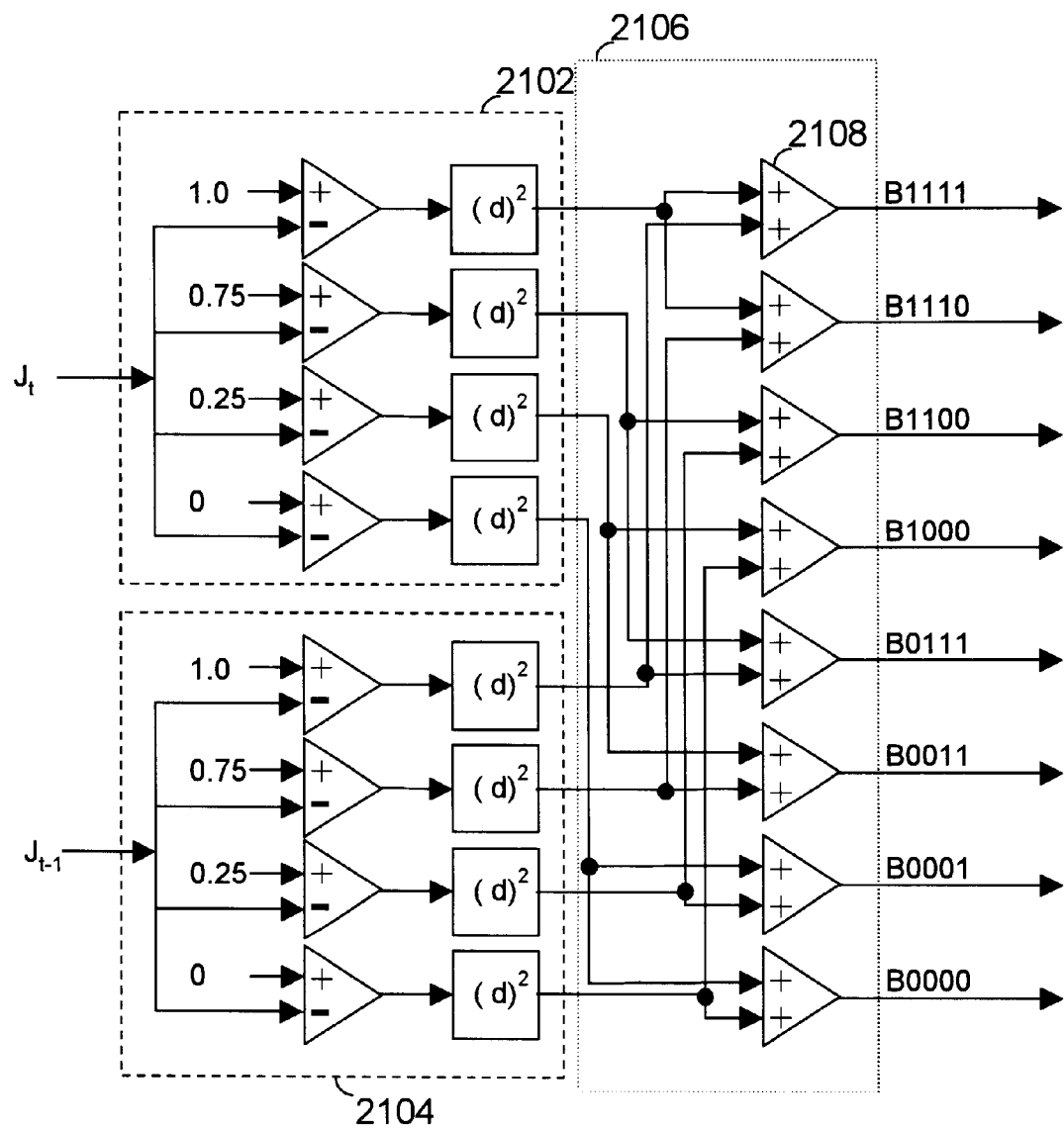
FIG. 21 is a structural block diagram illustrating the branch metric calculation circuit shown in FIG. 18 in the EQ(T)_VD(2T) mode.

Referring now to FIG. 21, it illustrates a structural block diagram of branch metric calculation circuit 1804 in FIG. 18 for P(1, 2, 1) equalization in EQ(T)_VD(2T) mode. A subtraction square calculation unit 2102 computes the squares of $J_t$–1.0, $J_t$–0.75, $J_t$–0.25, and $J_t$–0, and a subtraction square calculation units 2104 computes the squares of $J_{t-1}$–1.0, $J_{t-1}$–0.75, $J_{t-1}$–0.25, and $J_{t-1}$–0 respectively. After performing summation using these squares, adders 2108 then output the branch metrics B0000, B0001, B0011, B0111, B1000, B1100, B1110, and B1111 respectively. In addition, branch mapper 2106 is formed by all of adders 2108 and the connection of adders 2108.

As disclosed above, the Viterbi detector according to the invention can be used for different PRML signal processing apparatuses such as hard disk drives, tape systems, as well as optical disk systems. For different PR equalizations with different parameters in various systems, it is required to design different Viterbi detectors, that is, to implement different trellis diagrams and reference levels corresponding to the PR equalizations. By the embodiment of the invention, an approach to a union of different trellis diagrams associated with different PR equalizations is illustrated. In this way, a Viterbi detector associated with different trellis diagrams or reference levels can be implemented by a single piece of hardware. Thus, the objects of saving hardware space and conveniently switching to different PR equalizations are achieved.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A Viterbi detector for use in a partial response maximum likelihood (PRML) signal processing apparatus, the PRML signal processing apparatus including a partial response (PR) equalizer, the PR equalizer outputting a PR equalizer output signal serially, the Viterbi detector used for receiving the PR equalizer output signal, wherein the PR equalizer operates at a first frequency and the Viterbi detector operates at a second frequency, and the Viterbi detector is capable of performing Viterbi detection according to PR equalizations with a plurality of sets of parameters in the PR equalizer, the Viterbi detector comprising:

an input buffer for receiving the PR equalizer output signal, and selectively outputting the PR equalizer output signal serially or in parallel, according to the first frequency and the second frequency;

a branch metric calculation unit for receiving the PR equalizer output signal outputted by the input buffer and receiving a reference level value stored in a reference level register so as to obtain a plurality of branch metrics;

an add-compare-select (ACS) circuit for receiving the branch metrics and calculating a plurality of path metrics, and obtaining a plurality of path control signals;

a path memory unit comprising a detection sequence switch, the path memory unit being for receiving the path control signals, using an output bit value stored in a storage unit as an input to the detection sequence switch, and outputting a Viterbi detector output signal; and a clock buffer for generating a clock signal at the second frequency and outputting the clock signal at the second frequency to the branch metric calculation unit, the ACS circuit, and the path memory unit;

wherein the detector sequence switch is operative according to a union trellis diagram relation, the union trellis diagram relation is obtained by combining trellis diagram relations associated with the PR equalizations with the sets of parameters in the PR equalizer and setting the PR equalizer and the Viterbi detector operating at the first frequency and the second frequency respectively, the union trellis diagram relation indicates a plurality of sets of output bits and a plurality of sets of reference levels which are associated with the PR equalizations with the sets of parameters respectively, the output bits are stored in the storage unit, the reference levels are stored in the reference level register, and according to the first, second frequencies, and the PR equalization with the set of parameters, the storage unit and the reference level register output the output bit value and the reference level value respectively.

2. A Viterbi detector according to claim 1, wherein the union trellis diagram relation corresponds to a trellis diagram including a plurality of branches, and the branches that do not exist are associated with the reference levels which are set to infinity.

3. A Viterbi detector according to claim 1, wherein the second frequency is equal to two times the first frequency.

4. A Viterbi detector according to claim 3, wherein the input buffer outputs the PR equalizer output signal in parallel.

5. A Viterbi detector according to claim 1, wherein the first frequency is equal to the second frequency.

6. A Viterbi detector according to claim 5, wherein the input buffer outputs the PR equalizer output signal directly and serially.

7. A Viterbi detector according to claim 1, wherein the Viterbi detector output signal is a non-return-to-zero-inverted (NRZI) signal, or a non-return-to-zero (NRZ) signal.

8. A Viterbi detector for use in a partial response maximum likelihood (PRML) signal processing apparatus, the PRML signal processing apparatus including a partial response (PR) equalizer, the PR equalizer outputting a PR equalizer output signal serially, the Viterbi detector used for receiving the PR equalizer output signal, wherein the Viterbi detector is capable of performing Viterbi detection according to PR equalizations with a plurality of sets of parameters in the PR equalizer, the Viterbi detector comprising:

a branch metric calculation unit for receiving the PR equalizer output signal outputted by the input buffer and receiving a reference level value stored in a reference level register so as to obtain a plurality of branch metrics;

an add-compare-select (ACS) circuit for receiving the branch metrics and calculating a plurality of path metrics, and obtaining a plurality of path control signals;

a path memory unit comprising a detection sequence switch, the storage unit storing an output bit value, the path memory unit being for receiving the path control signals, using an output bit value stored in a storage unit as an input to the detection sequence switch, and outputting a Viterbi detector output signal; and a clock buffer for generating a clock signal at the second frequency and outputting the clock signal at the second frequency to the branch metric calculation unit, the ACS circuit, and the path memory unit;

wherein the detector sequence switch is operative according to a union trellis diagram relation, the union trellis diagram relation is obtained by combining trellis diagram relations associated with the PR equalizations with the sets of parameters in the PR equalizer, the union trellis diagram relation indicates a plurality of sets of output bits and a plurality of sets of reference levels which are associated with the PR equalizations with the sets of parameters respectively, the output bits are stored in the storage unit, the reference levels are stored in the reference level register, and according to the PR equalization with the set of parameters, the storage unit and the reference level register output the output bit value and the reference level value respectively.

9. A Viterbi detector according to claim 8, wherein the union trellis diagram relation corresponds to a trellis diagram including a plurality of branches, and the branches that do not exist are associated with the reference levels which are set to infinity.

10. A Viterbi detector according to claim 8, wherein the Viterbi detector output signal is a non-return-to-zero-inverted (NRZI) signal, or a non-return-to-zero (NRZ) signal.

11. A Viterbi detection method for use in a partial response maximum likelihood (PRML) signal processing apparatus, the PRML signal processing apparatus including a partial response (PR) equalizer, the PR equalizer outputting a PR equalizer output signal serially, the Viterbi detection method used for receiving the PR equalizer output signal, wherein the PR equalizer operates at a first frequency and the Viterbi detection method for use under a second frequency, and the Viterbi detection method is capable of performing Viterbi detection according to PR equalizations with a plurality of sets of parameters in the PR equalizer, the Viterbi detection method comprising the steps of:

obtaining a union trellis diagram relation by combining trellis diagram relations associated with the PR equalizations with the sets of parameters, wherein the union trellis diagram relation indicates a plurality of sets of output bits and a plurality of sets of reference levels which are associated with the PR equalizations with the sets of parameters respectively, the sets of output bits are stored in the storage unit, the sets of reference levels are stored in the reference level register, and according to the first, second frequencies, and the PR equalization with the set of parameters, the storage unit and the reference level register output a output bit value and a reference level value respectively;

inputting the PR equalizer output signal to an input buffer for receiving, and selectively outputting the PR equalizer output signal serially or in parallel, according to the first frequency and the second frequency;

inputting the PR equalizer output signal outputted by the input buffer to a branch metric calculation unit and obtaining a plurality of branch metrics according to the reference level value outputted by the reference level register;

inputting the branch metrics to an add-compare-select (ACS) circuit for calculating a plurality of path metrics, and obtaining a plurality of path control signals; and inputting the path control signals to a path memory unit comprising a detection sequence switch, and inputting an output bit value outputted by a storage unit to the detection sequence switch so as to obtain a Viterbi detector output signal, wherein the detection sequence switch corresponds with the union trellis diagram.

12. A Viterbi detection method according to claim 11, wherein the union trellis diagram relation corresponds to a trellis diagram including a plurality of branches, and the branches that do not exist are associated with the reference levels which are set to infinity.

13. A Viterbi detection method according to claim 11, wherein the second frequency is equal to two times the first frequency.

14. A Viterbi detection method according to claim 11, wherein the first frequency is equal to the second frequency.

* * * * *